US010134247B2

(12) United States Patent
McMahan et al.

(10) Patent No.: US 10,134,247 B2
(45) **Date of Patent: *Nov. 20, 2018**

(54) ACTIVE EMERGENCY EXIT SYSTEMS FOR BUILDINGS

(71) Applicant: Hand Held Products, Inc., Fort Mill, SC (US)

(72) Inventors: Ryan J. McMahan, Cedar Rapids, IA (US); Jason Schoon, North Liberty, IA (US)

(73) Assignee: Hand Held Products, Inc., Fort Mill, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/696,244

(22) Filed: Sep. 6, 2017

(65) Prior Publication Data

US 2017/0365140 A1 Dec. 21, 2017

Related U.S. Application Data

(63) Continuation of application No. 14/961,958, filed on Dec. 8, 2015, now Pat. No. 9,761,096.

(60) Provisional application No. 62/093,501, filed on Dec. 18, 2014.

(51) Int. Cl.
*G08B 7/06* (2006.01)
*G08B 25/08* (2006.01)

(52) U.S. Cl.
CPC ............. *G08B 7/062* (2013.01); *G08B 25/08* (2013.01); *H05K 999/99* (2013.01)

(58) Field of Classification Search
CPC .......... G08B 7/062; G08B 7/066; G08B 7/06; G08B 21/10; G08B 21/14; G08B 21/16; G08B 21/182; G08B 21/02; G08B 21/0423; G08B 25/00; G08B 25/014; G08B 25/08; G01C 21/206; A62B 3/00
USPC ........ 340/539.1, 539.11, 540, 577, 628, 632, 340/691.6; 345/633; 701/515
See application file for complete search history.

(56) References Cited

U.S. PATENT DOCUMENTS

| | | | |
|---|---|---|---|
| 6,832,725 | B2 | 12/2004 | Gardiner et al. |
| 7,035,650 | B1 | 4/2006 | Moskowitz et al. |
| 7,128,266 | B2 | 10/2006 | Zhu et al. |
| 7,159,783 | B2 | 1/2007 | Walczyk et al. |
| 7,413,127 | B2 | 8/2008 | Ehrhart et al. |
| 7,726,575 | B2 | 6/2010 | Wang et al. |

(Continued)

FOREIGN PATENT DOCUMENTS

| | | | |
|---|---|---|---|
| WO | 2013163789 | A1 | 11/2013 |

*Primary Examiner* — Hung T Nguyen
(74) *Attorney, Agent, or Firm* — Additon, Higgins & Pendleton, P.A.

(57) ABSTRACT

An active exit system may include one or more active exit signs, each exit sign having at least one sensor, a display, and a transceiver. Each active exit sign monitors building environmental conditions, monitors the locations of users and objects within the building, and assists in location services during normal operation. The exit signs transmit a dynamic exit plan to a user's electronic device based on the user's location. In response to sensing an emergency event, the exit sign transmits an emergency signal to the user's electronic device and updates a user's exit plan as needed based on the location of the emergency event. The exit sign also transmits user location information to emergency responders.

20 Claims, 5 Drawing Sheets

(56) References Cited

U.S. PATENT DOCUMENTS 7,924,149 B2 * 4/2011 Mendelson .......... G01C 21/206 340/539.11
8,294,969 B2 10/2012 Plesko
8,317,105 B2 11/2012 Kotlarsky et al.
8,322,622 B2 12/2012 Liu
8,366,005 B2 2/2013 Kotlarsky et al.
8,371,507 B2 2/2013 Haggerty et al.
8,376,233 B2 2/2013 Van Horn et al.
8,381,979 B2 2/2013 Franz
8,390,909 B2 3/2013 Plesko
8,408,464 B2 4/2013 Zhu et al.
8,408,468 B2 4/2013 Horn et al.
8,408,469 B2 4/2013 Good
8,424,768 B2 4/2013 Rueblinger et al.
8,448,863 B2 5/2013 Xian et al.
8,457,013 B2 6/2013 Essinger et al.
8,459,557 B2 6/2013 Havens et al.
8,469,272 B2 6/2013 Kearney
8,474,712 B2 7/2013 Kearney et al.
8,479,992 B2 7/2013 Kotlarsky et al.
8,490,877 B2 7/2013 Kearney
8,517,271 B2 8/2013 Kotlarsky et al.
8,523,076 B2 9/2013 Good
8,528,818 B2 9/2013 Ehrhart et al.
8,544,737 B2 10/2013 Gomez et al.
8,548,420 B2 10/2013 Grunow et al.
8,550,335 B2 10/2013 Samek et al.
8,550,354 B2 10/2013 Gannon et al.
8,550,357 B2 10/2013 Kearney
8,556,174 B2 10/2013 Kosecki et al.
8,556,176 B2 10/2013 Van Horn et al.
8,556,177 B2 10/2013 Hussey et al.
8,559,767 B2 10/2013 Barber et al.
8,561,895 B2 10/2013 Gomez et al.
8,561,903 B2 10/2013 Sauerwein
8,561,905 B2 10/2013 Edmonds et al.
8,565,107 B2 10/2013 Pease et al.
8,571,307 B2 10/2013 Li et al.
8,579,200 B2 11/2013 Samek et al.
8,583,924 B2 11/2013 Caballero et al.
8,584,945 B2 11/2013 Wang et al.
8,587,595 B2 11/2013 Wang
8,587,697 B2 11/2013 Hussey et al.
8,588,869 B2 11/2013 Sauerwein et al.
8,590,789 B2 11/2013 Nahill et al.
8,596,539 B2 12/2013 Havens et al.
8,596,542 B2 12/2013 Havens et al.
8,596,543 B2 12/2013 Havens et al.
8,599,271 B2 12/2013 Havens et al.
8,599,957 B2 12/2013 Peake et al.
8,600,158 B2 12/2013 Li et al.
8,600,167 B2 12/2013 Showering
8,602,309 B2 12/2013 Longacre et al.
8,608,053 B2 12/2013 Meier et al.
8,608,071 B2 12/2013 Liu et al.
8,611,309 B2 12/2013 Wang et al.
8,615,487 B2 12/2013 Gomez et al.
8,621,123 B2 12/2013 Caballero
8,622,303 B2 1/2014 Meier et al.
8,624,727 B2 * 1/2014 Saigh .................... H04W 4/029 340/539.13
8,628,013 B2 1/2014 Ding
8,628,015 B2 1/2014 Wang et al.
8,628,016 B2 1/2014 Winegar
8,629,926 B2 1/2014 Wang
8,630,491 B2 1/2014 Longacre et al.
8,635,309 B2 1/2014 Berthiaume et al.
8,636,200 B2 1/2014 Kearney
8,636,212 B2 1/2014 Nahill et al.
8,636,215 B2 1/2014 Ding et al.
8,636,224 B2 1/2014 Wang
8,638,806 B2 1/2014 Wang et al.
8,640,958 B2 2/2014 Lu et al.
8,640,960 B2 2/2014 Wang et al.
8,643,717 B2 2/2014 Li et al.
8,646,692 B2 2/2014 Meier et al.
8,646,694 B2 2/2014 Wang et al.
8,657,200 B2 2/2014 Ren et al.
8,659,397 B2 2/2014 Vargo et al.
8,668,149 B2 3/2014 Good
8,678,285 B2 3/2014 Kearney
8,678,286 B2 3/2014 Smith et al.
8,682,077 B1 3/2014 Longacre
D702,237 S 4/2014 Oberpriller et al.
8,687,282 B2 4/2014 Feng et al.
8,692,927 B2 4/2014 Pease et al.
8,695,880 B2 4/2014 Bremer et al.
8,698,949 B2 4/2014 Grunow et al.
8,702,000 B2 4/2014 Barber et al.
8,717,494 B2 5/2014 Gannon
8,720,783 B2 5/2014 Biss et al.
8,723,804 B2 5/2014 Fletcher et al.
8,723,904 B2 5/2014 Marty et al.
8,727,223 B2 5/2014 Wang
8,740,082 B2 6/2014 Wilz
8,740,085 B2 6/2014 Furlong et al.
8,746,563 B2 6/2014 Hennick et al.
8,750,445 B2 6/2014 Peake et al.
8,752,766 B2 6/2014 Xian et al.
8,756,059 B2 6/2014 Braho et al.
8,757,495 B2 6/2014 Qu et al.
8,760,563 B2 6/2014 Koziol et al.
8,763,909 B2 7/2014 Reed et al.
8,777,108 B2 7/2014 Coyle
8,777,109 B2 7/2014 Oberpriller et al.
8,779,898 B2 7/2014 Havens et al.
8,781,520 B2 7/2014 Payne et al.
8,783,573 B2 7/2014 Havens et al.
8,789,757 B2 7/2014 Barten
8,789,758 B2 7/2014 Hawley et al.
8,789,759 B2 7/2014 Xian et al.
8,794,520 B2 8/2014 Wang et al.
8,794,522 B2 8/2014 Ehrhart
8,794,525 B2 8/2014 Amundsen et al.
8,794,526 B2 8/2014 Wang et al.
8,798,367 B2 8/2014 Ellis
8,807,431 B2 8/2014 Wang et al.
8,807,432 B2 8/2014 Van Horn et al.
8,820,630 B2 9/2014 Qu et al.
8,822,848 B2 9/2014 Meagher
8,824,692 B2 9/2014 Sheerin et al.
8,824,696 B2 9/2014 Braho
8,842,849 B2 9/2014 Wahl et al.
8,844,822 B2 9/2014 Kotlarsky et al.
8,844,823 B2 9/2014 Fritz et al.
8,849,019 B2 9/2014 Li et al.
D716,285 S 10/2014 Chaney et al.
8,851,383 B2 10/2014 Yeakley et al.
8,854,633 B2 10/2014 Laffargue
8,866,963 B2 10/2014 Grunow et al.
8,868,421 B2 10/2014 Braho et al.
8,868,519 B2 10/2014 Maloy et al.
8,868,802 B2 10/2014 Barten
8,868,803 B2 10/2014 Caballero
8,870,074 B1 10/2014 Gannon
8,878,666 B2 * 11/2014 Chu ...................... G01S 5/0231 340/500
8,879,639 B2 11/2014 Sauerwein
8,880,426 B2 11/2014 Smith
8,881,983 B2 11/2014 Havens et al.
8,881,987 B2 11/2014 Wang
8,903,172 B2 12/2014 Smith
8,908,995 B2 12/2014 Benos et al.
8,910,870 B2 12/2014 Li et al.
8,910,875 B2 12/2014 Ren et al.
8,914,290 B2 12/2014 Hendrickson et al.
8,914,788 B2 12/2014 Pettinelli et al.
8,915,439 B2 12/2014 Feng et al.
8,915,444 B2 12/2014 Havens et al.
8,916,789 B2 12/2014 Woodburn
8,918,250 B2 12/2014 Hollifield
8,918,564 B2 12/2014 Caballero
8,925,818 B2 1/2015 Kosecki et al.
8,939,374 B2 1/2015 Jovanovski et al.

(56) References Cited

U.S. PATENT DOCUMENTS 8,942,480 B2 1/2015 Ellis
8,944,313 B2 2/2015 Williams et al.
8,944,327 B2 2/2015 Meier et al.
8,944,332 B2 2/2015 Harding et al.
8,950,678 B2 2/2015 Germaine et al.
D723,560 S 3/2015 Zhou et al.
8,967,468 B2 3/2015 Gomez et al.
8,971,346 B2 3/2015 Sevier
8,976,030 B2 3/2015 Cunningham et al.
8,976,368 B2 3/2015 Akel et al.
8,978,981 B2 3/2015 Guan
8,978,983 B2 3/2015 Bremer et al.
8,978,984 B2 3/2015 Hennick et al.
8,985,456 B2 3/2015 Zhu et al.
8,985,457 B2 3/2015 Soule et al.
8,985,459 B2 3/2015 Kearney et al.
8,985,461 B2 3/2015 Gelay et al.
8,988,578 B2 3/2015 Showering
8,988,590 B2 3/2015 Gillet et al.
8,991,704 B2 3/2015 Hopper et al.
8,996,194 B2 3/2015 Davis et al.
8,996,384 B2 3/2015 Funyak et al.
8,998,091 B2 4/2015 Edmonds et al.
9,002,641 B2 4/2015 Showering
9,007,368 B2 4/2015 Laffargue et al.
9,010,641 B2 4/2015 Qu et al.
9,015,513 B2 4/2015 Murawski et al.
9,016,576 B2 4/2015 Brady et al.
D730,357 S 5/2015 Fitch et al.
9,022,288 B2 5/2015 Nahill et al.
9,030,964 B2 5/2015 Essinger et al.
9,033,240 B2 5/2015 Smith et al.
9,033,242 B2 5/2015 Gillet et al.
9,036,054 B2 5/2015 Koziol et al.
9,037,344 B2 5/2015 Chamberlin
9,038,911 B2 5/2015 Xian et al.
9,038,915 B2 5/2015 Smith
D730,901 S 6/2015 Oberpriller et al.
D730,902 S 6/2015 Fitch et al.
9,047,098 B2 6/2015 Barten
9,047,359 B2 6/2015 Caballero et al.
9,047,420 B2 6/2015 Caballero
9,047,525 B2 6/2015 Barber
9,047,531 B2 6/2015 Showering et al.
9,049,640 B2 6/2015 Wang et al.
9,053,055 B2 6/2015 Caballero
9,053,378 B1 6/2015 Hou et al.
9,053,380 B2 6/2015 Xian et al.
9,057,641 B2 6/2015 Amundsen et al.
9,058,526 B2 6/2015 Powilleit
9,061,527 B2 6/2015 Tobin et al.
9,064,165 B2 6/2015 Havens et al.
9,064,167 B2 6/2015 Xian et al.
9,064,168 B2 6/2015 Todeschini et al.
9,064,254 B2 6/2015 Todeschini et al.
9,066,032 B2 6/2015 Wang
9,070,032 B2 6/2015 Corcoran
D734,339 S 7/2015 Zhou et al.
D734,751 S 7/2015 Oberpriller et al.
9,076,459 B2 7/2015 Braho et al.
9,079,423 B2 7/2015 Bouverie et al.
9,080,856 B2 7/2015 Laffargue
9,082,023 B2 7/2015 Feng et al.
9,084,032 B2 7/2015 Rautiola et al.
9,087,250 B2 7/2015 Coyle
9,092,681 B2 7/2015 Havens et al.
9,092,682 B2 7/2015 Wilz et al.
9,092,683 B2 7/2015 Koziol et al.
9,093,141 B2 7/2015 Liu
9,098,763 B2 8/2015 Lu et al.
9,104,929 B2 8/2015 Todeschini
9,104,934 B2 8/2015 Li et al.
9,107,484 B2 8/2015 Chaney
9,111,159 B2 8/2015 Liu et al.
9,111,166 B2 8/2015 Cunningham
9,135,483 B2 9/2015 Liu et al.
9,137,009 B1 9/2015 Gardiner
9,141,839 B2 9/2015 Xian et al.
9,147,096 B2 9/2015 Wang
9,148,474 B2 9/2015 Skvoretz
9,158,000 B2 10/2015 Sauerwein
9,158,340 B2 10/2015 Reed et al.
9,158,953 B2 10/2015 Gillet et al.
9,159,059 B2 10/2015 Daddabbo et al.
9,165,174 B2 10/2015 Huck
9,171,543 B2 10/2015 Emerick et al.
9,183,425 B2 11/2015 Wang
9,189,669 B2 11/2015 Zhu et al.
9,195,844 B2 11/2015 Todeschini et al.
9,202,458 B2 12/2015 Braho et al.
9,208,366 B2 12/2015 Liu
9,208,367 B2 12/2015 Wang
9,219,836 B2 12/2015 Bouverie et al.
9,224,022 B2 12/2015 Ackley et al.
9,224,024 B2 12/2015 Bremer et al.
9,224,027 B2 12/2015 Van Horn et al.
D747,321 S 1/2016 London et al.
9,230,140 B1 1/2016 Ackley
9,235,553 B2 1/2016 Fitch et al.
9,239,950 B2 1/2016 Fletcher
9,245,492 B2 1/2016 Ackley et al.
9,443,123 B2 1/2016 Hejl
9,248,640 B2 2/2016 Heng
9,250,652 B2 2/2016 London et al.
9,250,712 B1 2/2016 Todeschini
9,251,411 B2 2/2016 Todeschini
9,258,033 B2 2/2016 Showering
9,262,633 B1 2/2016 Todeschini et al.
9,262,660 B2 2/2016 Lu et al.
9,262,662 B2 2/2016 Chen et al.
9,269,036 B2 2/2016 Bremer
9,270,782 B2 2/2016 Hala et al.
9,274,812 B2 3/2016 Doren et al.
9,275,388 B2 3/2016 Havens et al.
9,277,668 B2 3/2016 Feng et al.
9,280,693 B2 3/2016 Feng et al.
9,286,496 B2 3/2016 Smith
9,297,900 B2 3/2016 Jiang
9,298,964 B2 3/2016 Li et al.
9,301,427 B2 3/2016 Feng et al.
9,304,376 B2 4/2016 Anderson
9,310,609 B2 4/2016 Rueblinger et al.
9,313,377 B2 4/2016 Todeschini et al.
9,317,037 B2 4/2016 Byford et al.
D757,009 S 5/2016 Oberpriller et al.
9,342,723 B2 5/2016 Liu et al.
9,342,724 B2 5/2016 McCloskey
9,361,882 B2 6/2016 Ressler et al.
9,365,381 B2 6/2016 Colonel et al.
9,373,018 B2 6/2016 Colavito et al.
9,375,945 B1 6/2016 Bowles
9,378,403 B2 6/2016 Wang et al.
D760,719 S 7/2016 Zhou et al.
9,360,304 B2 7/2016 Chang et al.
9,383,848 B2 7/2016 Daghigh
9,384,374 B2 7/2016 Bianconi
9,390,596 B1 7/2016 Todeschini
D762,604 S 8/2016 Fitch et al.
9,411,386 B2 8/2016 Sauerwein
9,412,242 B2 8/2016 Van Horn et al.
9,418,269 B2 8/2016 Havens et al.
9,418,270 B2 8/2016 Van Volkinburg et al.
9,423,318 B2 8/2016 Lui et al.
D766,244 S 9/2016 Zhou et al.
9,443,222 B2 9/2016 Singel et al.
9,454,689 B2 9/2016 McCloskey et al.
9,464,885 B2 10/2016 Lloyd et al.
9,465,967 B2 10/2016 Xian et al.
9,478,113 B2 10/2016 Xie et al.
9,478,983 B2 10/2016 Kather et al.
D771,631 S 11/2016 Fitch et al.
9,481,186 B2 11/2016 Bouverie et al.
9,488,986 B1 11/2016 Solanki
9,489,782 B2 11/2016 Payne et al.

(56) References Cited

U.S. PATENT DOCUMENTS

| | | | | |
|---|---|---|---|---|
| 9,490,540 | B1 | 11/2016 | Davies et al. | |
| 9,491,729 | B2 | 11/2016 | Rautiola et al. | |
| 9,497,092 | B2 | 11/2016 | Gomez et al. | |
| 9,507,974 | B1 | 11/2016 | Todeschini | |
| 9,519,814 | B2 | 12/2016 | Cudzilo | |
| 9,521,331 | B2 | 12/2016 | Bessettes et al. | |
| 9,530,038 | B2 | 12/2016 | Xian et al. | |
| D777,166 | S | 1/2017 | Bidwell et al. | |
| 9,558,386 | B2 | 1/2017 | Yeakley | |
| 9,572,901 | B2 | 2/2017 | Todeschini | |
| 9,606,581 | B1 | 3/2017 | Howe et al. | |
| D783,601 | S | 4/2017 | Schulte et al. | |
| D785,617 | S | 5/2017 | Bidwell et al. | |
| D785,636 | S | 5/2017 | Oberpriller et al. | |
| 9,646,189 | B2 | 5/2017 | Lu et al. | |
| 9,646,191 | B2 | 5/2017 | Unemyr et al. | |
| 9,652,648 | B2 | 5/2017 | Ackley et al. | |
| 9,652,653 | B2 | 5/2017 | Todeschini et al. | |
| 9,656,487 | B2 | 5/2017 | Ho et al. | |
| 9,659,198 | B2 | 5/2017 | Giordano et al. | |
| D790,505 | S | 6/2017 | Vargo et al. | |
| D790,546 | S | 6/2017 | Zhou et al. | |
| 9,680,282 | B2 | 6/2017 | Hanenburg | |
| 9,697,401 | B2 | 7/2017 | Feng et al. | |
| 9,701,140 | B1 | 7/2017 | Alaganchelly et al. | |
| 9,761,096 | B2 | 9/2017 | McMahan et al. | |
| 2005/0190053 | A1* | 9/2005 | Dione | G06Q 10/06 340/500 |
| 2005/0200492 | A1* | 9/2005 | Woodard | G08B 21/14 340/632 |
| 2007/0049259 | A1* | 3/2007 | Onishi | A62B 99/00 455/414.2 |
| 2007/0063048 | A1 | 3/2007 | Havens et al. | |
| 2009/0134221 | A1 | 5/2009 | Zhu et al. | |
| 2009/0164580 | A1 | 6/2009 | Schultz et al. | |
| 2010/0177076 | A1 | 7/2010 | Essinger et al. | |
| 2010/0177080 | A1 | 7/2010 | Essinger et al. | |
| 2010/0177707 | A1 | 7/2010 | Essinger et al. | |
| 2010/0177749 | A1 | 7/2010 | Essinger et al. | |
| 2011/0032109 | A1 | 2/2011 | Fox | |
| 2011/0136463 | A1 | 6/2011 | Ebdon et al. | |
| 2011/0169999 | A1 | 7/2011 | Grunow et al. | |
| 2011/0202554 | A1 | 8/2011 | Powilleit et al. | |
| 2011/0211563 | A1 | 9/2011 | Herrala et al. | |
| 2012/0111946 | A1 | 5/2012 | Golant | |
| 2012/0168512 | A1 | 7/2012 | Kotlarsky et al. | |
| 2012/0193423 | A1 | 8/2012 | Samek | |
| 2012/0203647 | A1 | 8/2012 | Smith | |
| 2012/0223141 | A1 | 9/2012 | Good et al. | |
| 2013/0043312 | A1 | 2/2013 | Van Horn | |
| 2013/0075168 | A1 | 3/2013 | Amundsen et al. | |
| 2013/0116922 | A1 | 5/2013 | Cai et al. | |
| 2013/0175341 | A1 | 7/2013 | Kearney et al. | |
| 2013/0175343 | A1 | 7/2013 | Good | |
| 2013/0257744 | A1 | 10/2013 | Daghigh et al. | |
| 2013/0257759 | A1 | 10/2013 | Daghigh | |
| 2013/0270346 | A1 | 10/2013 | Xian et al. | |
| 2013/0292475 | A1 | 11/2013 | Kotlarsky et al. | |
| 2013/0292477 | A1 | 11/2013 | Hennick et al. | |
| 2013/0293539 | A1 | 11/2013 | Hunt et al. | |
| 2013/0293540 | A1 | 11/2013 | Laffargue et al. | |
| 2013/0306728 | A1 | 11/2013 | Thuries et al. | |
| 2013/0306731 | A1 | 11/2013 | Pedraro | |
| 2013/0307964 | A1 | 11/2013 | Bremer et al. | |
| 2013/0308625 | A1 | 11/2013 | Park et al. | |
| 2013/0313324 | A1 | 11/2013 | Koziol et al. | |
| 2013/0332524 | A1 | 12/2013 | Fiala et al. | |
| 2014/0001267 | A1 | 1/2014 | Giordano et al. | |
| 2014/0002828 | A1 | 1/2014 | Laffargue et al. | |
| 2014/0025584 | A1 | 1/2014 | Liu et al. | |
| 2014/0100813 | A1 | 1/2014 | Showering | |
| 2014/0034734 | A1 | 2/2014 | Sauerwein | |
| 2014/0039693 | A1 | 2/2014 | Havens et al. | |
| 2014/0049120 | A1 | 2/2014 | Kohtz et al. | |
| 2014/0049635 | A1 | 2/2014 | Laffargue et al. | |
| 2014/0061306 | A1 | 3/2014 | Wu et al. | |
| 2014/0063289 | A1 | 3/2014 | Hussey et al. | |
| 2014/0066136 | A1 | 3/2014 | Sauerwein et al. | |
| 2014/0067692 | A1 | 3/2014 | Ye et al. | |
| 2014/0070005 | A1 | 3/2014 | Nahill et al. | |
| 2014/0071840 | A1 | 3/2014 | Venancio | |
| 2014/0074746 | A1 | 3/2014 | Wang | |
| 2014/0076974 | A1 | 3/2014 | Havens et al. | |
| 2014/0078342 | A1 | 3/2014 | Li et al. | |
| 2014/0098792 | A1 | 4/2014 | Wang et al. | |
| 2014/0100774 | A1 | 4/2014 | Showering | |
| 2014/0103115 | A1 | 4/2014 | Meier et al. | |
| 2014/0104413 | A1 | 4/2014 | McCloskey et al. | |
| 2014/0104414 | A1 | 4/2014 | McCloskey et al. | |
| 2014/0104416 | A1 | 4/2014 | Giordano et al. | |
| 2014/0106725 | A1 | 4/2014 | Sauerwein | |
| 2014/0108010 | A1 | 4/2014 | Maltseff et al. | |
| 2014/0108402 | A1 | 4/2014 | Gomez et al. | |
| 2014/0108682 | A1 | 4/2014 | Caballero | |
| 2014/0110485 | A1 | 4/2014 | Toa et al. | |
| 2014/0114530 | A1 | 4/2014 | Fitch et al. | |
| 2014/0125853 | A1 | 5/2014 | Wang | |
| 2014/0125999 | A1 | 5/2014 | Longacre et al. | |
| 2014/0129378 | A1 | 5/2014 | Richardson | |
| 2014/0131443 | A1 | 5/2014 | Smith | |
| 2014/0131444 | A1 | 5/2014 | Wang | |
| 2014/0133379 | A1 | 5/2014 | Wang et al. | |
| 2014/0136208 | A1 | 5/2014 | Maltseff et al. | |
| 2014/0140585 | A1 | 5/2014 | Wang | |
| 2014/0152882 | A1 | 6/2014 | Samek et al. | |
| 2014/0158770 | A1 | 6/2014 | Sevier et al. | |
| 2014/0159869 | A1 | 6/2014 | Zumsteg et al. | |
| 2014/0166755 | A1 | 6/2014 | Liu et al. | |
| 2014/0166757 | A1 | 6/2014 | Smith | |
| 2014/0167956 | A1 | 6/2014 | Chu | |
| 2014/0168787 | A1 | 6/2014 | Wang et al. | |
| 2014/0175165 | A1 | 6/2014 | Havens et al. | |
| 2014/0191913 | A1 | 7/2014 | Ge et al. | |
| 2014/0197239 | A1 | 7/2014 | Havens et al. | |
| 2014/0197304 | A1 | 7/2014 | Feng et al. | |
| 2014/0204268 | A1 | 7/2014 | Grunow et al. | |
| 2014/0214631 | A1 | 7/2014 | Hansen | |
| 2014/0217166 | A1 | 8/2014 | Berthiaume et al. | |
| 2014/0217180 | A1 | 8/2014 | Liu | |
| 2014/0231500 | A1 | 8/2014 | Ehrhart et al. | |
| 2014/0247315 | A1 | 9/2014 | Marty et al. | |
| 2014/0253326 | A1 | 9/2014 | Cho et al. | |
| 2014/0263493 | A1 | 9/2014 | Amurgis et al. | |
| 2014/0263645 | A1 | 9/2014 | Smith et al. | |
| 2014/0270196 | A1 | 9/2014 | Braho et al. | |
| 2014/0270229 | A1 | 9/2014 | Braho | |
| 2014/0278387 | A1 | 9/2014 | DiGregorio | |
| 2014/0282210 | A1 | 9/2014 | Bianconi | |
| 2014/0288933 | A1 | 9/2014 | Braho et al. | |
| 2014/0297058 | A1 | 10/2014 | Barker et al. | |
| 2014/0299665 | A1 | 10/2014 | Barber et al. | |
| 2014/0351317 | A1 | 11/2014 | Smith et al. | |
| 2014/0362184 | A1 | 12/2014 | Jovanovski et al. | |
| 2014/0363015 | A1 | 12/2014 | Braho | |
| 2014/0369511 | A1 | 12/2014 | Sheerin et al. | |
| 2014/0374483 | A1 | 12/2014 | Lu | |
| 2014/0374485 | A1 | 12/2014 | Xian et al. | |
| 2015/0001301 | A1 | 1/2015 | Ouyang | |
| 2015/0009338 | A1 | 1/2015 | Laffargue et al. | |
| 2015/0014416 | A1 | 1/2015 | Kotlarsky et al. | |
| 2015/0021397 | A1 | 1/2015 | Rueblinger et al. | |
| 2015/0028104 | A1 | 1/2015 | Ma et al. | |
| 2015/0029002 | A1 | 1/2015 | Yeakley et al. | |
| 2015/0032709 | A1 | 1/2015 | Maloy et al. | |
| 2015/0039309 | A1 | 2/2015 | Braho et al. | |
| 2015/0040378 | A1 | 2/2015 | Saber et al. | |
| 2015/0049347 | A1 | 2/2015 | Laffargue et al. | |
| 2015/0051992 | A1 | 2/2015 | Smith | |
| 2015/0053769 | A1 | 2/2015 | Thuries et al. | |
| 2015/0062366 | A1 | 3/2015 | Liu et al. | |
| 2015/0063215 | A1 | 3/2015 | Wang | |
| 2015/0088522 | A1 | 3/2015 | Hendrickson et al. | |
| 2015/0096872 | A1 | 4/2015 | Woodburn | |
| 2015/0100196 | A1 | 4/2015 | Hollifield | |

(56) References Cited

U.S. PATENT DOCUMENTS

| | | | |
|---|---|---|---|
| 2015/0115035 | A1 | 4/2015 | Meier et al. |
| 2015/0127791 | A1 | 5/2015 | Kosecki et al. |
| 2015/0128116 | A1 | 5/2015 | Chen et al. |
| 2015/0133047 | A1 | 5/2015 | Smith et al. |
| 2015/0134470 | A1 | 5/2015 | Hejl et al. |
| 2015/0136851 | A1 | 5/2015 | Harding et al. |
| 2015/0142492 | A1 | 5/2015 | Kumar |
| 2015/0144692 | A1 | 5/2015 | Hejl |
| 2015/0144698 | A1 | 5/2015 | Teng et al. |
| 2015/0149946 | A1 | 5/2015 | Benos et al. |
| 2015/0161429 | A1 | 6/2015 | Xian |
| 2015/0170503 | A1 | 6/2015 | Wedig et al. |
| 2015/0186703 | A1 | 7/2015 | Chen et al. |
| 2015/0199957 | A1 | 7/2015 | Funyak et al. |
| 2015/0210199 | A1 | 7/2015 | Payne |
| 2015/0220753 | A1 | 8/2015 | Zhu et al. |
| 2015/0254485 | A1 | 9/2015 | Feng et al. |
| 2015/0310243 | A1 | 10/2015 | Ackley |
| 2015/0310389 | A1 | 10/2015 | Crimm et al. |
| 2015/0327012 | A1 | 11/2015 | Bian et al. |
| 2015/0348220 | A1* | 12/2015 | Sharma ................ G06Q 50/265 705/324 |
| 2016/0014251 | A1 | 1/2016 | Hejl |
| 2016/0040982 | A1 | 2/2016 | Li et al. |
| 2016/0042241 | A1 | 2/2016 | Todeschini |
| 2016/0057230 | A1 | 2/2016 | Todeschini et al. |
| 2016/0062473 | A1 | 3/2016 | Bouchat et al. |
| 2016/0092805 | A1 | 3/2016 | Geisler et al. |
| 2016/0101936 | A1 | 4/2016 | Chamberlin |
| 2016/0102975 | A1 | 4/2016 | McCloskey et al. |
| 2016/0104019 | A1 | 4/2016 | Todeschini et al. |
| 2016/0104274 | A1 | 4/2016 | Jovanovski et al. |
| 2016/0109219 | A1 | 4/2016 | Ackley et al. |
| 2016/0109220 | A1 | 4/2016 | Laffargue |
| 2016/0109224 | A1 | 4/2016 | Thuries et al. |
| 2016/0112631 | A1 | 4/2016 | Ackley et al. |
| 2016/0112643 | A1 | 4/2016 | Laffargue et al. |
| 2016/0117627 | A1 | 4/2016 | Raj et al. |
| 2016/0124516 | A1 | 5/2016 | Schoon et al. |
| 2016/0125217 | A1 | 5/2016 | Todeschini |
| 2016/0125342 | A1 | 5/2016 | Miller et al. |
| 2016/0133253 | A1 | 5/2016 | Braho et al. |
| 2016/0171597 | A1 | 6/2016 | Todeschini |
| 2016/0171666 | A1 | 6/2016 | McCloskey |
| 2016/0171720 | A1 | 6/2016 | Todeschini |
| 2016/0171775 | A1 | 6/2016 | Todeschini et al. |
| 2016/0171777 | A1 | 6/2016 | Todeschini et al. |
| 2016/0174674 | A1 | 6/2016 | Oberpriller et al. |
| 2016/0178479 | A1 | 6/2016 | Goldsmith |
| 2016/0178685 | A1 | 6/2016 | Young et al. |
| 2016/0178707 | A1 | 6/2016 | Young et al. |
| 2016/0179132 | A1 | 6/2016 | Harr et al. |
| 2016/0179143 | A1 | 6/2016 | Bidwell et al. |
| 2016/0179368 | A1 | 6/2016 | Roeder |
| 2016/0179378 | A1 | 6/2016 | Kent et al. |
| 2016/0180130 | A1 | 6/2016 | Bremer |
| 2016/0180133 | A1 | 6/2016 | Oberpriller et al. |
| 2016/0180136 | A1 | 6/2016 | Meier et al. |
| 2016/0180594 | A1 | 6/2016 | Todeschini |
| 2016/0180663 | A1 | 6/2016 | McMahan et al. |
| 2016/0180678 | A1 | 6/2016 | Ackley et al. |
| 2016/0180713 | A1 | 6/2016 | Bernhardt et al. |
| 2016/0185136 | A1 | 6/2016 | Ng et al. |
| 2016/0185291 | A1 | 6/2016 | Chamberlin |
| 2016/0186926 | A1 | 6/2016 | Oberpriller et al. |
| 2016/0188861 | A1 | 6/2016 | Todeschini |
| 2016/0188939 | A1 | 6/2016 | Sailors et al. |
| 2016/0188940 | A1 | 6/2016 | Lu et al. |
| 2016/0188941 | A1 | 6/2016 | Todeschini et al. |
| 2016/0188942 | A1 | 6/2016 | Good et al. |
| 2016/0188943 | A1 | 6/2016 | Linwood |
| 2016/0188944 | A1 | 6/2016 | Wilz et al. |
| 2016/0189076 | A1 | 6/2016 | Mellott et al. |
| 2016/0189087 | A1 | 6/2016 | Morton et al. |
| 2016/0189088 | A1 | 6/2016 | Pecorari et al. |
| 2016/0189092 | A1 | 6/2016 | George et al. |
| 2016/0189284 | A1 | 6/2016 | Mellott et al. |
| 2016/0189288 | A1 | 6/2016 | Todeschini |
| 2016/0189366 | A1 | 6/2016 | Chamberlin et al. |
| 2016/0189443 | A1 | 6/2016 | Smith |
| 2016/0189447 | A1 | 6/2016 | Valenzuela |
| 2016/0189489 | A1 | 6/2016 | Au et al. |
| 2016/0191684 | A1 | 6/2016 | DiPiazza et al. |
| 2016/0192051 | A1 | 6/2016 | DiPiazza et al. |
| 2016/0125873 | A1 | 7/2016 | Braho et al. |
| 2016/0202951 | A1 | 7/2016 | Pike et al. |
| 2016/0202958 | A1 | 7/2016 | Zabel et al. |
| 2016/0202959 | A1 | 7/2016 | Doubleday et al. |
| 2016/0203021 | A1 | 7/2016 | Pike et al. |
| 2016/0203429 | A1 | 7/2016 | Mellott et al. |
| 2016/0203797 | A1 | 7/2016 | Pike et al. |
| 2016/0203820 | A1 | 7/2016 | Zabel et al. |
| 2016/0204623 | A1 | 7/2016 | Haggert et al. |
| 2016/0204636 | A1 | 7/2016 | Allen et al. |
| 2016/0204638 | A1 | 7/2016 | Miraglia et al. |
| 2016/0316190 | A1 | 7/2016 | McCloskey et al. |
| 2016/0227912 | A1 | 8/2016 | Oberpriller et al. |
| 2016/0232891 | A1 | 8/2016 | Pecorari |
| 2016/0292477 | A1 | 10/2016 | Bidwell |
| 2016/0294779 | A1 | 10/2016 | Yeakley et al. |
| 2016/0306769 | A1 | 10/2016 | Kohtz et al. |
| 2016/0314276 | A1 | 10/2016 | Sewell et al. |
| 2016/0314294 | A1 | 10/2016 | Kubler et al. |
| 2016/0323310 | A1 | 11/2016 | Todeschini et al. |
| 2016/0325677 | A1 | 11/2016 | Fitch et al. |
| 2016/0327614 | A1 | 11/2016 | Young et al. |
| 2016/0327930 | A1 | 11/2016 | Charpentier et al. |
| 2016/0328762 | A1 | 11/2016 | Pape |
| 2016/0330218 | A1 | 11/2016 | Hussey et al. |
| 2016/0343163 | A1 | 11/2016 | Venkatesha et al. |
| 2016/0343176 | A1 | 11/2016 | Ackley |
| 2016/0364914 | A1 | 12/2016 | Todeschini |
| 2016/0370220 | A1 | 12/2016 | Ackley et al. |
| 2016/0372282 | A1 | 12/2016 | Bandringa |
| 2016/0373847 | A1 | 12/2016 | Vargo et al. |
| 2016/0377414 | A1 | 12/2016 | Thuries et al. |
| 2016/0377417 | A1 | 12/2016 | Jovanovski et al. |
| 2017/0010141 | A1 | 1/2017 | Ackley |
| 2017/0010328 | A1 | 1/2017 | Mullen et al. |
| 2017/0010780 | A1 | 1/2017 | Waldron et al. |
| 2017/0016714 | A1 | 1/2017 | Laffargue et al. |
| 2017/0018094 | A1 | 1/2017 | Todeschini |
| 2017/0046603 | A1 | 2/2017 | Lee et al. |
| 2017/0047864 | A1 | 2/2017 | Stang et al. |
| 2017/0053146 | A1 | 2/2017 | Liu et al. |
| 2017/0053147 | A1 | 2/2017 | Geramine et al. |
| 2017/0053647 | A1 | 2/2017 | Nichols et al. |
| 2017/0055606 | A1 | 3/2017 | Xu et al. |
| 2017/0060316 | A1 | 3/2017 | Larson |
| 2017/0061961 | A1 | 3/2017 | Nichols et al. |
| 2017/0064634 | A1 | 3/2017 | Van Horn et al. |
| 2017/0083730 | A1 | 3/2017 | Feng et al. |
| 2017/0091502 | A1 | 3/2017 | Furlong et al. |
| 2017/0091706 | A1 | 3/2017 | Lloyd et al. |
| 2017/0091741 | A1 | 3/2017 | Todeschini |
| 2017/0091904 | A1 | 3/2017 | Ventress |
| 2017/0092908 | A1 | 3/2017 | Chaney |
| 2017/0094238 | A1 | 3/2017 | Germaine et al. |
| 2017/0098947 | A1 | 4/2017 | Wolski |
| 2017/0100949 | A1 | 4/2017 | Celinder et al. |
| 2017/0108838 | A1 | 4/2017 | Todeschini et al. |
| 2017/0108895 | A1 | 4/2017 | Chamberlin et al. |
| 2017/0118355 | A1 | 4/2017 | Wong et al. |
| 2017/0123598 | A1 | 5/2017 | Phan et al. |
| 2017/0124369 | A1 | 5/2017 | Rueblinger et al. |
| 2017/0124396 | A1 | 5/2017 | Todeschini et al. |
| 2017/0124687 | A1 | 5/2017 | McCloskey et al. |
| 2017/0126873 | A1 | 5/2017 | McGary et al. |
| 2017/0126904 | A1 | 5/2017 | d'Armancourt et al. |
| 2017/0139012 | A1 | 5/2017 | Smith |
| 2017/0140329 | A1 | 5/2017 | Bernhardt et al. |
| 2017/0140731 | A1 | 5/2017 | Smith |
| 2017/0147847 | A1 | 5/2017 | Berggren et al. |
| 2017/0150124 | A1 | 5/2017 | Thuries |

(56) References Cited

U.S. PATENT DOCUMENTS

| | | | |
|---|---|---|---|
| 2017/0169198 | A1 | 6/2017 | Nichols |
| 2017/0171035 | A1 | 6/2017 | Lu et al. |
| 2017/0171703 | A1 | 6/2017 | Maheswaranathan |
| 2017/0171803 | A1 | 6/2017 | Maheswaranathan |
| 2017/0180359 | A1 | 6/2017 | Wolski et al. |
| 2017/0180577 | A1 | 6/2017 | Nguon et al. |
| 2017/0181299 | A1 | 6/2017 | Shi et al. |
| 2017/0190192 | A1 | 7/2017 | Delario et al. |
| 2017/0193432 | A1 | 7/2017 | Bernhardt |
| 2017/0193461 | A1 | 7/2017 | Jonas et al. |
| 2017/0193727 | A1 | 7/2017 | Van Horn et al. |
| 2017/0200108 | A1 | 7/2017 | Au et al. |
| 2017/0200275 | A1 | 7/2017 | McCloskey et al. |

* cited by examiner

ACTIVE EMERGENCY EXIT SYSTEMS FOR BUILDINGS

CROSS-REFERENCE TO RELATED APPLICATIONS

The present application claims the benefit of U.S. patent application Ser. No. 14/961,958 for Active Emergency Exit Systems for Buildings filed Dec. 8, 2015 (and published Jun. 23, 2016 as U.S. Patent Publication No. 2016/0180663), now U.S. Pat. No. 9,761,096, which claims the benefit of U.S. Provisional Patent Application No. 62/093,501 for an ACTIVE EXIT SYSTEM filed Dec. 18, 2014. Each of the foregoing patent applications, patent publication, and patent is hereby incorporated by reference in its entirety.

FIELD

Embodiments of the present invention generally relate to the field of exit systems and, more specifically, to active exit systems for buildings that include exit signs to assist building occupants when exiting buildings during emergency events.

BACKGROUND

Building codes (e.g., the International Code Council's (ICC) INTERNATIONAL BUILDING CODE (IBC)) specify that commercial buildings be outfitted (i.e., equipped) with exit signs to indicate building exits. Although specific signage requirements may vary, exits and exit access doors are generally required to be marked with signs placed throughout the facility according to the applicable building code requirements. In the case of external power failure, such as during an emergency situation, the required exit signs must remain illuminated and visible when operating in a reserve or emergency power mode.

Typical exit signs that are installed in commercial buildings or other similar structures, however, are simply passive illuminated indicators. Accordingly, typical passive exit signs are unable to monitor conditions and adapt to an emergency situation in order to dynamically provide additional life-safety information in the case of specific types of emergency events.

Therefore, a need exists for more effective building exit systems, including but not limited to exit systems that contribute to life-safety monitoring and aid building occupants and/or safety personnel during emergency situations.

SUMMARY

The exemplary active exit systems described herein may include at least one active exit sign that provides location services to users during normal operation, and further provides alerts to users and emergency crews regarding emergency events. Each active exit sign may be capable of monitoring surrounding conditions within the building environment and assisting in locating objects and occupants within the building environment. Generally, the active exit sign can provide aid to building occupants as well as emergency responders during emergency situations.

The exemplary active exit signs may be mounted near (i.e., proximate, adjacent, etc.) a respective exit of a building or a respective exit of a part of the building, such as a respective floor or room of the building (e.g., pursuant to applicable building code requirements). In an exemplary embodiment, each exit sign includes an active display on the front of the sign housing. The display may be connected to a processor and can be dynamically updated to display various messages.

In an exemplary embodiment, each exit sign may include at least one sensor. The sensors may include, but are not limited to, a human presence sensor, a temperature sensor, a humidity sensor, a noxious gas sensor, and a fire sensor (i.e., a sensor to detect the presence of a flame or fire). One or more of these sensors monitor conditions in the local building environment. During normal, non-emergency operation, these sensors may be useful for monitoring building conditions such as occupancy, temperature, humidity, etc., and may be associated with or connected to a ventilation control system (i.e., heating, ventilating, air conditioning system) to aid with proper heating and cooling.

With regard to the human presence sensor of an exemplary exit sign, an exemplary sign may include a sensor that can physically detect the presence of a human. For example, the sign can include a motion sensor, a carbon dioxide sensor, or other sensor to detect the physical presence of a human (i.e., a building occupant).

An exemplary sign may also be equipped to indirectly detect the presence of a user/human by sensing the presence of personal electronic devices that communicate with a transceiver integrated with the active exit sign. The transceiver may be configured to communicate with the user's personal electronic device and to automatically send an exit plan to the user's electronic device. The exit plan could provide useful information including, but not limited to, a map of the building, a map of a floor of the building, the user's current location, and a preferred exit path for the user based on the user's location.

During normal non-emergency operation, the active exit system may be configured to track the location of users (i.e., building occupants). For example, each exit sign may be capable of detecting and tracking the relative position of at least one personal electronic device nearby wherein each personal electronic device is associated with a person and/or an object. In this regard, the personal electronic devices act as positional devices. The tracking components of the exit sign and the positional devices may be electronic components or devices that communicate with each other (e.g., through a local server, a remote server, or a direct connection such as a BLUETOOTH connection). The transceiver on the exit sign and/or the exit sign sensor may be configured to receive/detect positional information for at least one person/occupant. The processor of the exit sign can then generate positional data corresponding to the respective positions of each positional device.

The exemplary active exit system may be configured to also monitor/track the location (i.e., the positional data) of users that are not carrying an electronic device through another form of human presence sensor (e.g., carbon dioxide sensor, motion sensor, etc.).

During an emergency event, the respective transceiver of an exemplary exit sign may transmit positional data to a central server, or directly to a cloud server, where the positional data can be transmitted and/or received by an emergency responder. The transmission of the positional data may typically be accomplished through a wireless radio transmitter or a BLUETOOTH transmitter.

The exemplary exit signs may be equipped with a memory component integrated with the respective processors of the signs in order to store positional data, building maps, and other information.

The sensors of the exemplary exit signs may be used for detecting emergency events (e.g., detecting a fire, detecting the presence of a noxious gas, etc.). When an emergency event is sensed by at least one of the sensors, the exit sign transceiver may transmit an emergency signal to each user's electronic device as well as to the central server.

In an exemplary embodiment, when a fire sensor detects a fire in a particular location (e.g., near the exit sign), a processor may generate an updated exit plan, and the transceiver may transmit the updated exit plan to the electronic devices of nearby users. Accordingly, the exit sign can update exit plans for users to reroute them away from the exit associated with the affected emergency event.

When an emergency event (e.g., fire, noxious gas, etc.) is no longer detected, an exit sign display may be updated to transmit an all-clear message, and the exit sign may transmit an "all-clear" message to the electronic devices of users.

The active exit system may further include a software application that operates on a user's electronic device. This application assists the electronic device in processing and displaying information received from an exit sign. The application may be configured to automatically launch upon receipt of an emergency event signal from the exit sign, and automatically display exit directions and/or a map with exit plans.

Each exit sign may be equipped to receive power from an external power source, and a backup internal power source. For instance, during normal operation the exit sign may receive power from the electrical wiring of the building. During emergency operation, however, the exit sign can switch to the backup internal power supply (e.g., a battery).

The foregoing illustrative summary, as well as other exemplary objectives and/or advantages of the invention, and the manner in which the same are accomplished, are further explained within the following detailed description and its accompanying drawings.

DETAILED DESCRIPTION

Figure 1:
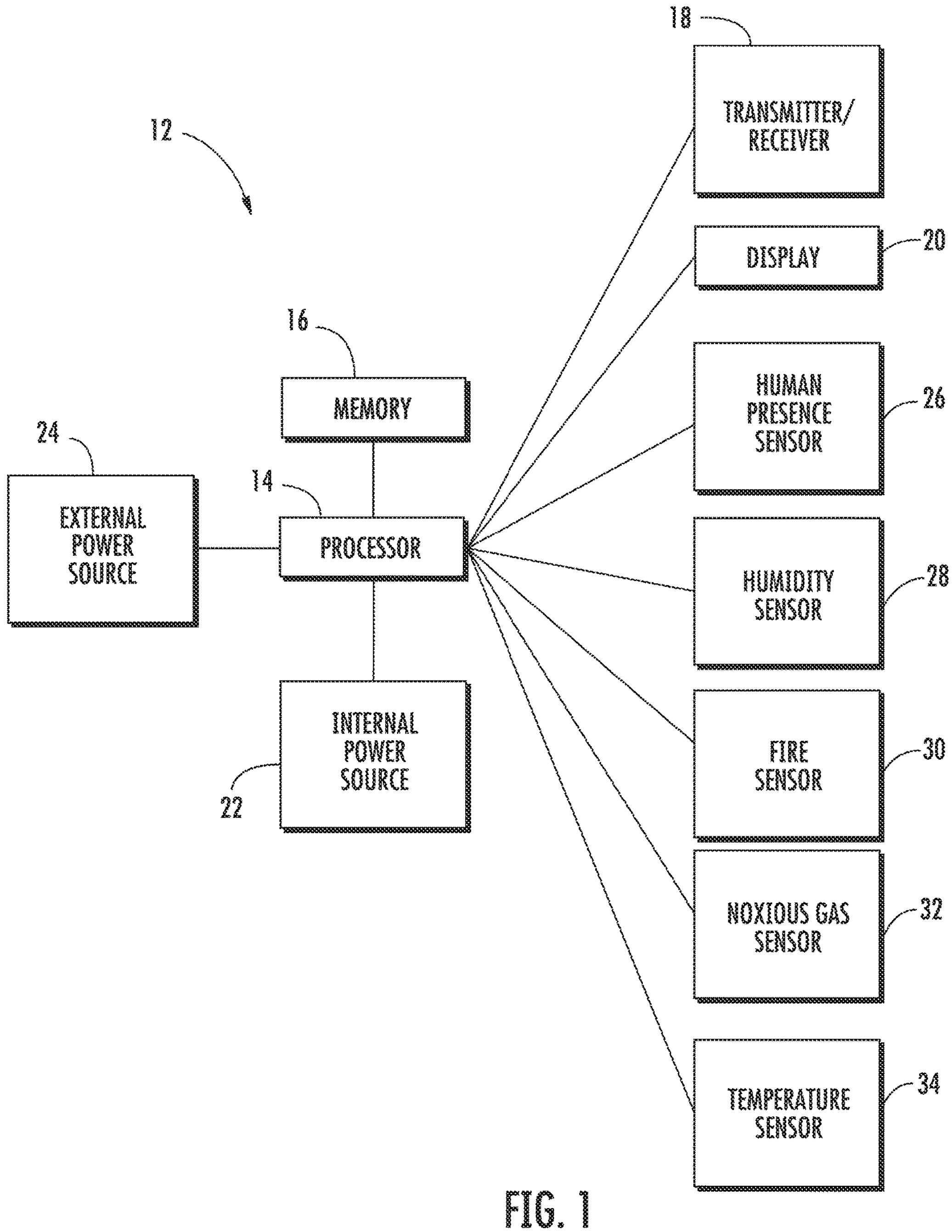
FIG. 1 is a block diagram illustrating certain components of an exemplary active exit sign.
Figure 2:
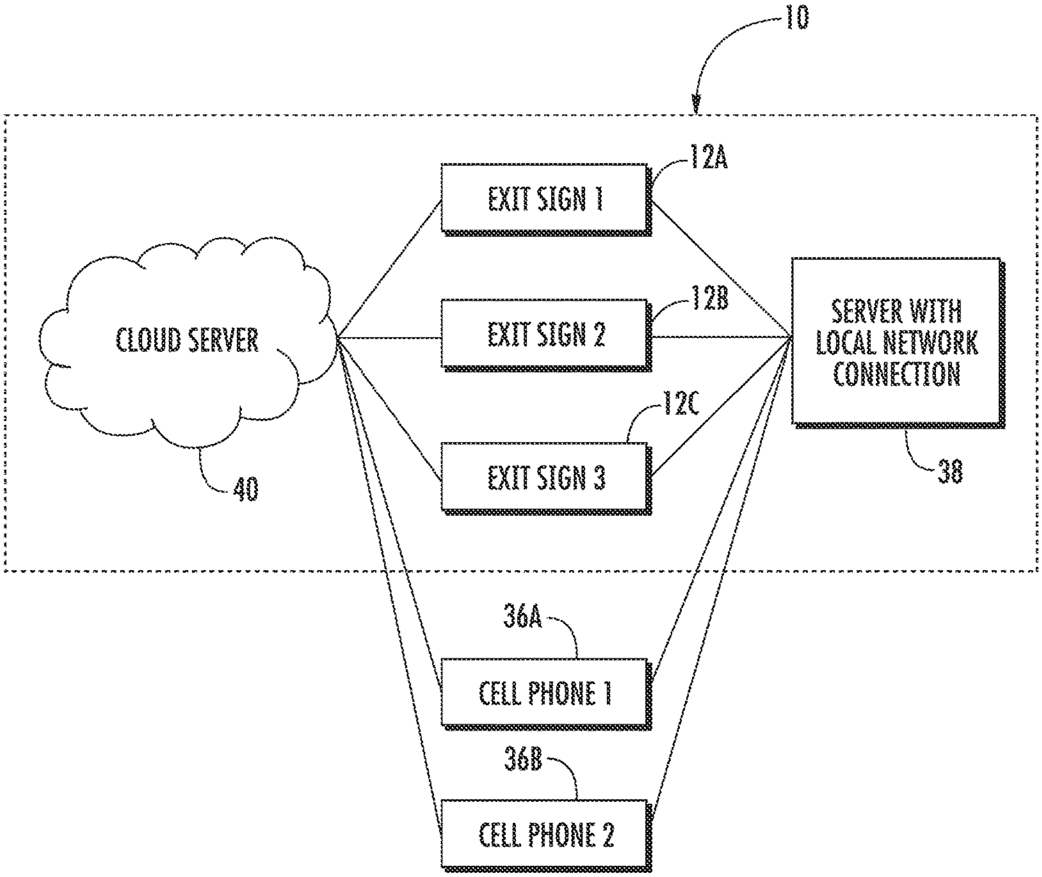
FIG. 2 is a block diagram illustrating an exemplary active exit system with connections to electronic devices through a local server or a cloud-based server.

Referring now to the drawings (FIGS. 1-5), an exemplary embodiment of the active exit system of the present disclosure is illustrated and generally indicated as reference number 10 (FIG. 2). As will hereinafter be more fully described, the active exit system 10 allows a user to receive location services regarding people and objects during normal operation, to receive an emergency exit plan during normal operation, and to receive a dynamically updated emergency exit plan and other information during an emergency event. An emergency event may include events such as a building fire, a gas leak in a building, or another condition in the building environment that creates a hazard to people within the building (i.e., building occupants). The exemplary active exit system also provides information about people and objects within a building environment to emergency responders during an emergency event.

In the exemplary embodiment, the active exit system includes one or more active exit signs. Each exit sign is located near an exit of a building, or an exit of a floor of a building as may be required by applicable building codes. Each exemplary exit sign has a housing that supports the electronic components of the exit sign. The exit signs can be a single board computer capable of hosting a variety of environmental sensors as well as antennas and radios for communication. The signs may include sensors to detect human presence, temperature, humidity, noxious gases, fire, and other environmental conditions.

FIG. 1 illustrates certain components that may be contained within or partially within the housing of an exemplary active exit sign 12. The exit sign 12 includes a processor 14, a memory component 16, a transmitter/receiver 18, a display 20, an internal power source 22, an external power source 24, and at least one sensor (26, 28, 30, 32, 34). These components are electrically connected and are secured within the housing. FIG. 1 illustrates the processor 14 connected directly to the other electronic components.

The display component 20 may be located on a front surface of the active exit sign 12 and provides information about the exit plan to a user viewing the exit sign 12. The display can be a static display that has one or more backlit messages, or the display can be a dynamic display, such as an LCD (liquid crystal display).

Each exemplary exit sign 12 includes a transmitter/receiver 18 that is configured to transmit information about the building environment to occupants and emergency responders, as well as receive information from a central server 38 (FIG. 2) and individual user's electronic devices. In particular, the transceiver may be configured to send an exit plan to a user's electronic device (e.g., a cell phone or other personal electronic device). Each transmitted exit plan contains information that is useful for at least one user. In the context of this disclosure, the exit sign 12 may include one or more transceivers 18 for communicating with various devices. Some example communication systems include, but are not limited to, wired LAN, fiber optic, Wi-Fi, BLUETOOTH, cellular, RF, and Ultra-Wideband (UWB) transceivers, as may be required within the building environment.

In the primary exemplary embodiment described herein, an internal power source 22 and an external power source 24 providing for redundant backup power are configured with the sign 12. In the exemplary embodiment, the external power source is connected to the building's electrical wiring. It is the primary power source, and is relied on during normal operation. During an emergency event, the exit sign can instead rely on the internal power source 22, such as a back-up battery within the exit sign housing, if the primary power is not available (e.g., the wiring is severed).

FIG. 2 illustrates an exemplary active exit system 10 having three exit signs 12A, 12B, 12C interacting with two users, each user having a personal electronic device, cell phone 1 36A, and cell phone 2 36B. The exit signs 12A, 12B, 12C are connected to a local network server 38, through a local network connection, such as a LAN or Wi-Fi connection. The exit signs 12A, 12B, 12C are also connected to a cloud server 40, for example through a cellular network connection. In case of an emergency, the local server 38 may lose power or functionality. Thus, the cloud server 40 is a backup server in this embodiment of the system 10. Users may instruct their cell phones to connect to one or both of the servers 38, 40. FIG. 2 shows the cell phones 36A, 36B being connected to both of the servers 38, 40 as well as a local exit sign 12A, 12B, 12C.

Exit plans stored in the local on-board memory component 16 of the exit sign provide a map of the building or a map of a portion of a building such as a floor. The memory component 16 is also useful for storing information about user location, object locations, emergency event logs, sensor logs, user identities, object identities, logs of users and objects, and other information.

Figure 3:
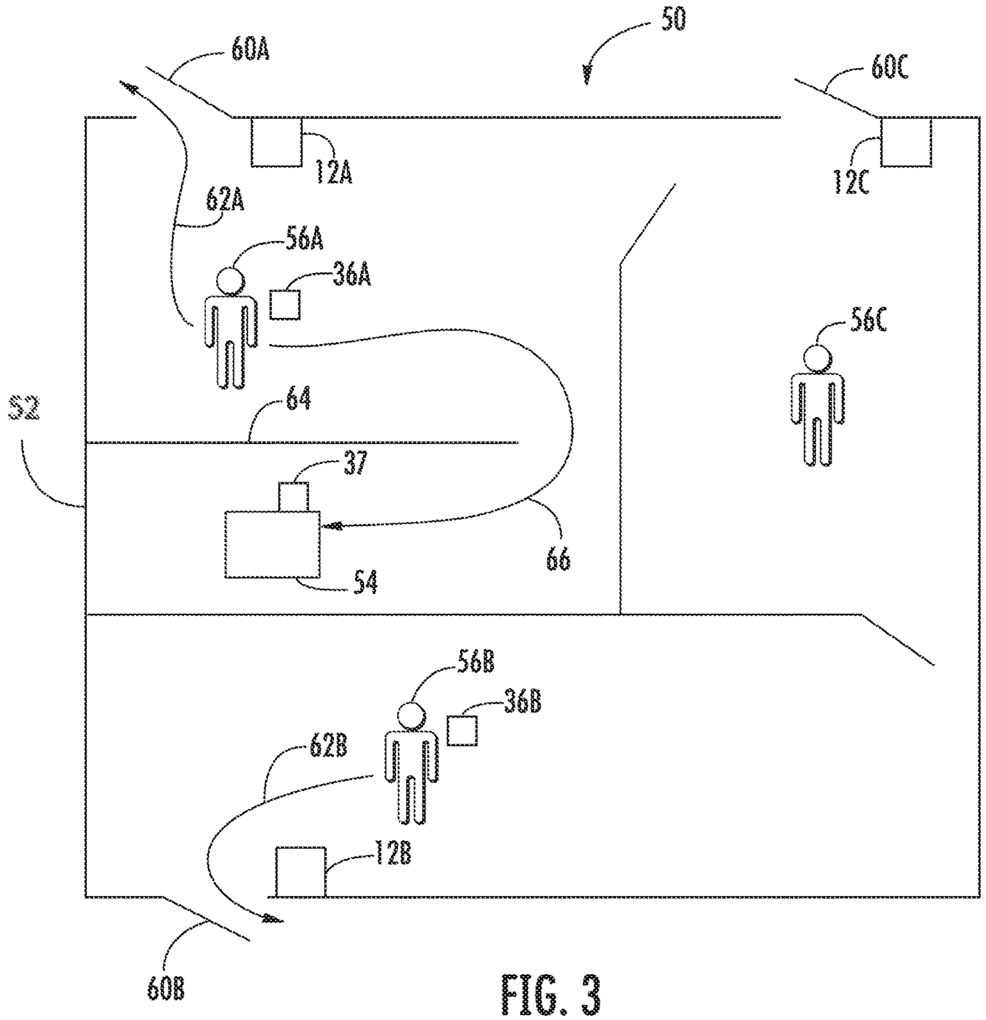
FIG. 3 is a diagram illustrating an exit route that may be transmitted to building occupants by the exemplary active exit system during normal operation.

FIG. 3 provides a map diagram 50 of a floor of a building. The map shows an area of the building bounded by an outer wall 52. Overlaid on the map 50 are relative locations of exit signs 12A, 12B, 12C; an object 54, such as a stairwell; and two users of the system 56A, 56B, having two cell phones 36A, 36B respectively carried by the two users. The map also shows a third user 56C, who is not carrying a cellphone/smartphone, or other electronic device that is connected to the active exit system 10. Each of the exit signs 12A, 12B, 12C is secured on a wall or a ceiling adjacent to a respective exit 60A, 60B, 60C, shown by doors in the outer wall 52.

Each exit sign 12A, 12B, 12C may operate as a tracking device by using a human presence sensor 26 (e.g., motion sensor, carbon dioxide sensor, etc.), the transceiver 18, or another sensor. For example, the exit sign can rely on a transceiver 18 to communicate with positional devices associated with users and objects in the area.

The positional devices can be incorporated into personal electronic devices or other electronic devices, for example, cell phones (i.e., smartphones) including an integrated GPS location device which can be used to identify the location of the user. In FIG. 2, the positional devices are the cell phones 36A, 36B. The processor 14 generates positional data based on information received by the exit sign transceiver 18. When an emergency event is sensed, this positional data can then be transmitted by the exit sign to the server 38 where it can be received by emergency responders. If the local network is disabled, the exit signs 12 can communicate directly with a cloud server 40 through a cellular connection. Thus, exit signs 12A, 12B detect the first and second users 56A, 56B by receiving signals from the respective users' cell phones 36A, 36B. Exit sign 12C detects the third user 56C through a human presence sensor.

FIG. 3 illustrates exit routes 62A, 62B that are generated by the active exit system 10 and respectively sent to users 56A, 56B on a map diagram that may be similar to the map shown in FIG. 3. The map may be received on the user's cell phones 36A, 36B. The map sent to the user may or may not show the locations of other users in the area.

FIG. 3 also illustrates how the active exit system 10 is useful for directing a user to an object 54 within the local environment. FIG. 3 shows object 54, for example a stairwell/fire extinguisher that is obstructed from view of the first user 56A by internal wall 64. The first exit sign 12A detects the location of user 56A by communicating with the user's cell phone 36A. The first exit sign 12A also communicates with an object positional device 37 secured to or located adjacent to the object 54, to receive location information corresponding to the object 54. The first user 56A requests the first exit sign 12A or the active exit system server 38 to guide the first user 56A to the object 54. The exit sign 12A transmits to the first user 56A a map showing the path 66 from the location of the first user 56A to the location of the object 54.

When an emergency event is sensed by at least one of the sensors of an exit sign 12A, 12B, 12C, the transceiver 18 of the respective exit sign transmits an emergency signal to a user's electronic device 36A, 36B if the user is in a region affected by the emergency. Users can also be notified of an emergency event in other locations on their electronic devices through communication with the servers 38, 40. The transceiver 18 can also send a signal directly to other exit signs. In turn, these exit signs can modify their respective displays 20 on their respective sign housings to show an emergency message.

When a fire sensor 30 detects a fire near its respective exit sign, that exit sign 12 generates and transmits an updated exit plan, to direct users away from the exit associated with that exit sign. The processor 14 on the sign 12 generates an updated exit plan, and the sign's transceiver 18 sends the updated exit plan to the electronic devices 36A, 36B of nearby users. The transceiver 18 of the exit sign 12 also sends an emergency message to servers 38, 40, which in turn transmit an emergency message to other exit signs 12 and/or electronic devices 36A, 36B belonging to users. Other exit signs can provide updated emergency maps to electronic devices of their respective nearby users.

Figure 4:
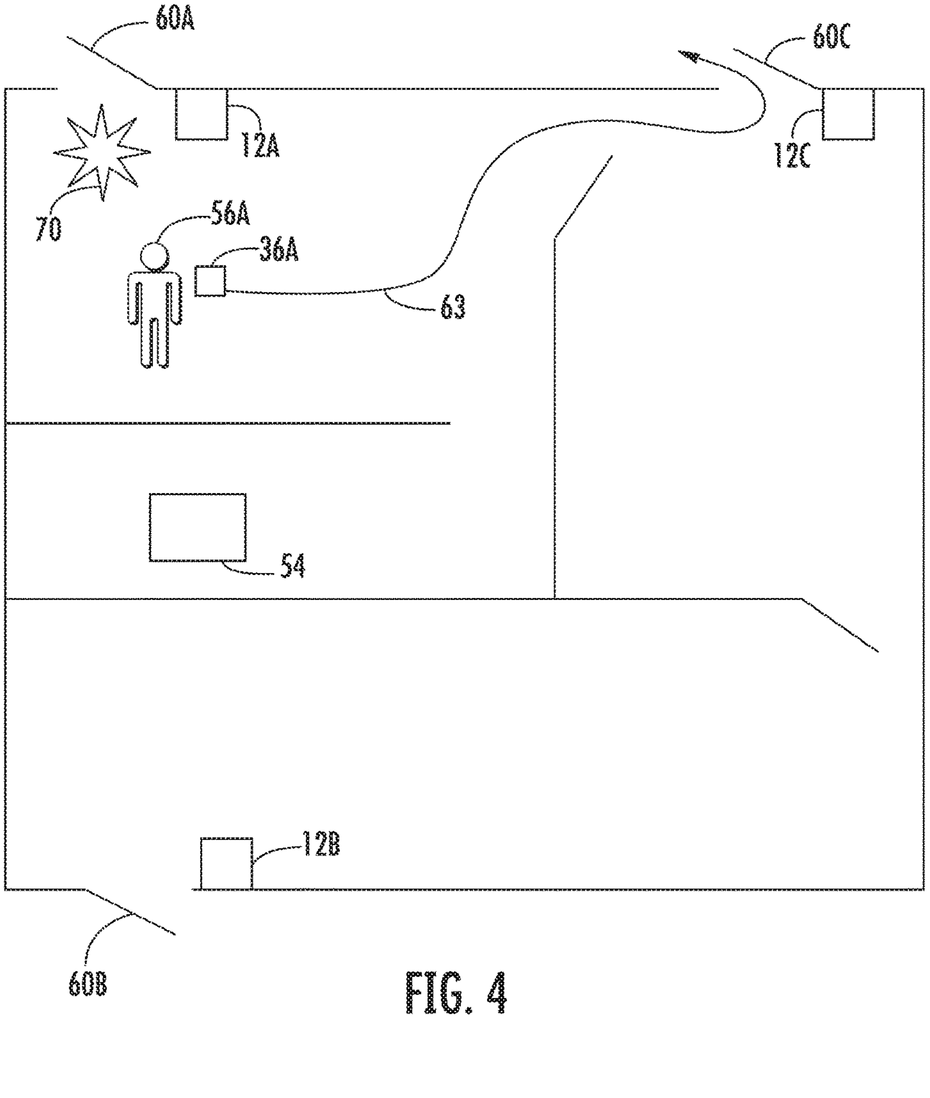
FIG. 4 is a diagram illustrating an exit route that may be transmitted to building occupants by the exemplary active exit system during an emergency event.

FIG. 4 illustrates the building environment of FIG. 3 during an emergency event in which a fire 70 is located near the first exit sign 12A. The first user 56A currently remains in the building, while the second and third users (56B and 56C) have already exited. Because the fire is adjacent exit 60A, the first user 56A is unable to use that exit. The exit sign 12A updates its display 20 to show that the exit 12A is unsafe. The exit sign 12A also updates the exit map for the first user 56A and transmits it to the user's electronic device 36A. FIG. 4 shows the new exit route 63 provided to the first user 56A.

After an emergency event is no longer sensed by the sensors of the exit sign, the sign displays an "all clear" message, and the sign transmits an "all clear" message to electronic devices of users.

Figure 5:
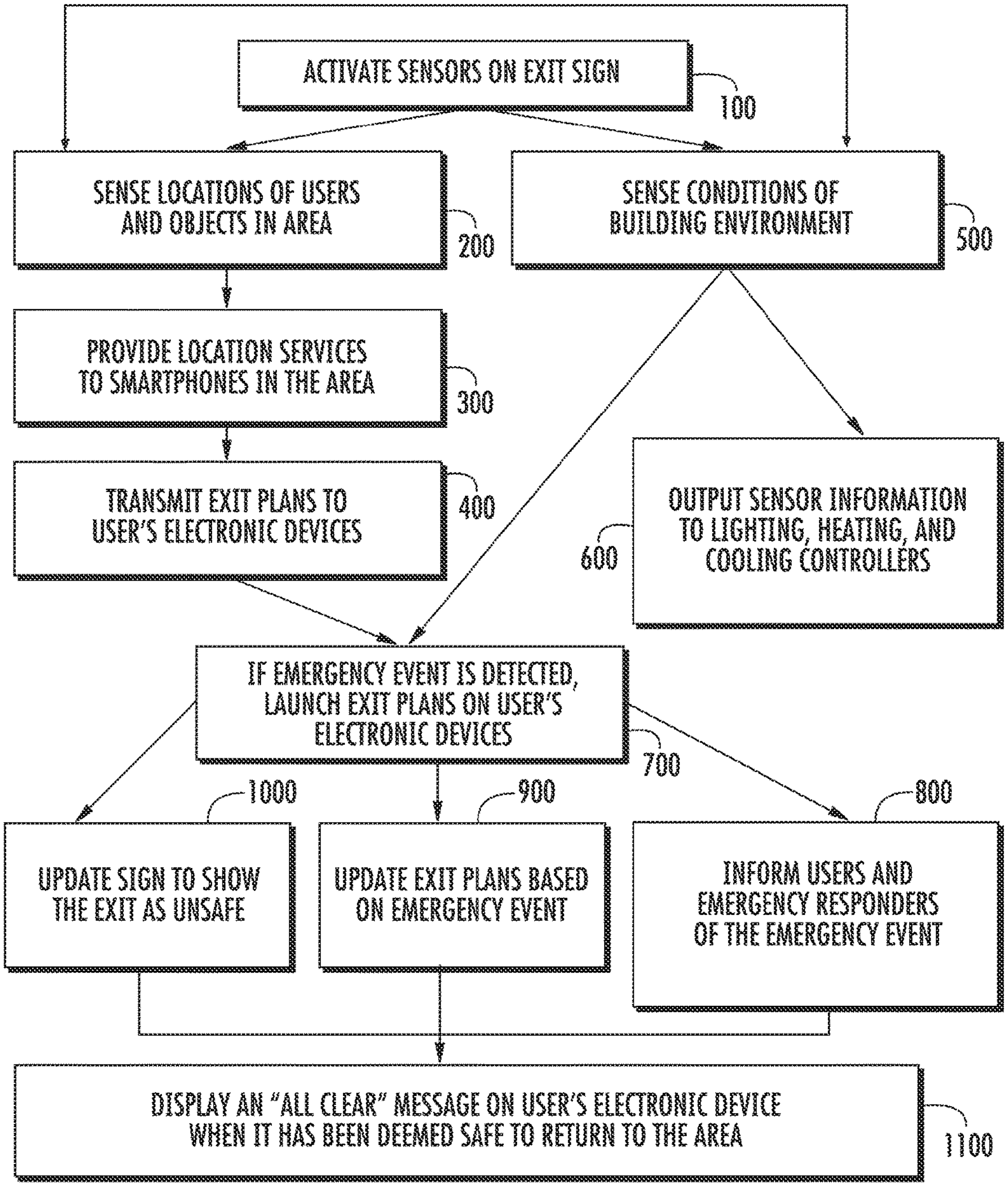
FIG. 5 is a flowchart illustrating the operation of an exemplary active exit system.

FIG. 5 is a flowchart that provides an overview of an exemplary operation of the active exit system 10; however, the scope of the present disclosure is not limited to the exemplary operation described herein. After the exit signs 12 are installed near exits in a building, the sensors are activated on each exit sign at step 100. Each exit sign 12 may be programmed to include its installation location, and may also include a location sensor with location data that is stored in memory 16.

During normal operation, the exit signs 12 are able to provide location services to users' electronic devices 36 (e.g. smartphones, wearables, tablet computers, or other personal electronic devices) in the area. At step 200, the signs 12 sense the locations of objects 54 and user devices 36. The exit signs 12 share the location information with the servers 38, 40. At step 300, the signs 12 provide location services to help people within the building find and locate exits or items.

At step 400, exit plans are transmitted from the exit sign 12 and downloaded to electronic devices 36 in the area. In the case of an emergency, those exit plans are automatically launched on the user electronic devices 36, augmenting the signage within the building.

Meanwhile, additional features may be implemented within the exit signs 12 during normal operation. At step 500, sensors in each exit sign sense conditions of the building environment.

At step 600, sensor information may be output and used in building environmental control systems. For example, temperature and humidity sensor information may be used in heating and cooling operations, and occupancy sensor information may be used for lighting, heating, and cooling control.

The sensors continuously monitor the building environment. If an emergency event is detected, at step 700 the exit signs 12 or the servers 38, 40 launch exit plans on the users' electronic devices 36. In addition to launching the exit plans, the users can be informed by a separate emergency alert at step 800.

At step 800, the system 10 also transmits a message to emergency responders arriving on the scene. In this way, emergency responders can get occupancy information when arriving on the scene. For example, the active exit system 10 can advise the emergency responders that ten users were occupying the third floor, only nine of them have exited, and one user is still detected near the south exit.

If necessary, exit plans are updated by the system 10 at step 900 based on the nature and location of the emergency event. For example, if fire is detected near an exit, the users' exit plan can be dynamically updated at step 900 and the sign 12 can update to show the exit as unsafe at step 1000 (for example, as shown in FIG. 4). This is possible even when there is a loss of power because the signs 12 can operate on backup power and the users' cell phones/smartphones 36 also operate on backup/battery power even during emergency events when there is a loss of external power. The exit sign 12 can provide specific information to users about an emergency event, such as that smoke has been detected in the southwest corner of the second floor of the building.

At step 1100, the exit sign 12 can then direct users' electronic devices 36 to display an "all clear" message when the active exit system 10 or a human controller of the system 10 has deemed that it is safe for people to return to the area.

After the emergency event, the exit signs 12 continue to sense the respective locations of users and objects in the area at step 200, and the exit signs 12 continue to sense conditions of the building environment at step 500.

The active exit system 10 provides, among other things, a thermostat/environmental control system, a security system, and a life safety system. Sensors and radios are useful for gathering and sharing the various forms of information.

The exit signs 12 can be built off of one or more mobile computer platforms. The active exit system 10 enables add-on software services for the sign 12, the servers 38, 40, and the electronic devices 36 of users.

In summary, it can be appreciated from the foregoing description and illustrations that the exemplary active exit systems and exit signs assist building occupants and emergency responders during emergency events. By monitoring and analyzing building conditions, the systems can also provide useful building information during non-emergency events.

To supplement the present disclosure, this application incorporates entirely by reference the following commonly assigned patents, patent application publications, and patent applications:

U.S. Pat. No. 6,832,725; U.S. Pat. No. 7,128,266;
U.S. Pat. No. 7,159,783; U.S. Pat. No. 7,413,127;
U.S. Pat. No. 7,726,575; U.S. Pat. No. 8,294,969;
U.S. Pat. No. 8,317,105; U.S. Pat. No. 8,322,622;
U.S. Pat. No. 8,366,005; U.S. Pat. No. 8,371,507;
U.S. Pat. No. 8,376,233; U.S. Pat. No. 8,381,979;
U.S. Pat. No. 8,390,909; U.S. Pat. No. 8,408,464;
U.S. Pat. No. 8,408,468; U.S. Pat. No. 8,408,469;
U.S. Pat. No. 8,424,768; U.S. Pat. No. 8,448,863;
U.S. Pat. No. 8,457,013; U.S. Pat. No. 8,459,557;
U.S. Pat. No. 8,469,272; U.S. Pat. No. 8,474,712;
U.S. Pat. No. 8,479,992; U.S. Pat. No. 8,490,877;
U.S. Pat. No. 8,517,271; U.S. Pat. No. 8,523,076;
U.S. Pat. No. 8,528,818; U.S. Pat. No. 8,544,737;
U.S. Pat. No. 8,548,242; U.S. Pat. No. 8,548,420;
U.S. Pat. No. 8,550,335; U.S. Pat. No. 8,550,354;
U.S. Pat. No. 8,550,357; U.S. Pat. No. 8,556,174;
U.S. Pat. No. 8,556,176; U.S. Pat. No. 8,556,177;
U.S. Pat. No. 8,559,767; U.S. Pat. No. 8,599,957;
U.S. Pat. No. 8,561,895; U.S. Pat. No. 8,561,903;
U.S. Pat. No. 8,561,905; U.S. Pat. No. 8,565,107;
U.S. Pat. No. 8,571,307; U.S. Pat. No. 8,579,200;
U.S. Pat. No. 8,583,924; U.S. Pat. No. 8,584,945;
U.S. Pat. No. 8,587,595; U.S. Pat. No. 8,587,697;
U.S. Pat. No. 8,588,869; U.S. Pat. No. 8,590,789;
U.S. Pat. No. 8,596,539; U.S. Pat. No. 8,596,542;
U.S. Pat. No. 8,596,543; U.S. Pat. No. 8,599,271;
U.S. Pat. No. 8,599,957; U.S. Pat. No. 8,600,158;
U.S. Pat. No. 8,600,167; U.S. Pat. No. 8,602,309;
U.S. Pat. No. 8,608,053; U.S. Pat. No. 8,608,071;
U.S. Pat. No. 8,611,309; U.S. Pat. No. 8,615,487;
U.S. Pat. No. 8,616,454; U.S. Pat. No. 8,621,123;
U.S. Pat. No. 8,622,303; U.S. Pat. No. 8,628,013;
U.S. Pat. No. 8,628,015; U.S. Pat. No. 8,628,016;
U.S. Pat. No. 8,629,926; U.S. Pat. No. 8,630,491;
U.S. Pat. No. 8,635,309; U.S. Pat. No. 8,636,200;
U.S. Pat. No. 8,636,212; U.S. Pat. No. 8,636,215;
U.S. Pat. No. 8,636,224; U.S. Pat. No. 8,638,806;
U.S. Pat. No. 8,640,958; U.S. Pat. No. 8,640,960;
U.S. Pat. No. 8,643,717; U.S. Pat. No. 8,646,692;
U.S. Pat. No. 8,646,694; U.S. Pat. No. 8,657,200;
U.S. Pat. No. 8,659,397; U.S. Pat. No. 8,668,149;
U.S. Pat. No. 8,678,285; U.S. Pat. No. 8,678,286;
U.S. Pat. No. 8,682,077; U.S. Pat. No. 8,687,282;
U.S. Pat. No. 8,692,927; U.S. Pat. No. 8,695,880;
U.S. Pat. No. 8,698,949; U.S. Pat. No. 8,717,494;
U.S. Pat. No. 8,717,494; U.S. Pat. No. 8,720,783;
U.S. Pat. No. 8,723,804; U.S. Pat. No. 8,723,904;
U.S. Pat. No. 8,727,223; U.S. Pat. No. D702,237;
U.S. Pat. No. 8,740,082; U.S. Pat. No. 8,740,085;
U.S. Pat. No. 8,746,563; U.S. Pat. No. 8,750,445;
U.S. Pat. No. 8,752,766; U.S. Pat. No. 8,756,059;
U.S. Pat. No. 8,757,495; U.S. Pat. No. 8,760,563;
U.S. Pat. No. 8,763,909; U.S. Pat. No. 8,777,108;
U.S. Pat. No. 8,777,109; U.S. Pat. No. 8,779,898;
U.S. Pat. No. 8,781,520; U.S. Pat. No. 8,783,573;
U.S. Pat. No. 8,789,757; U.S. Pat. No. 8,789,758;
U.S. Pat. No. 8,789,759; U.S. Pat. No. 8,794,520;
U.S. Pat. No. 8,794,522; U.S. Pat. No. 8,794,525;
U.S. Pat. No. 8,794,526; U.S. Pat. No. 8,798,367;
U.S. Pat. No. 8,807,431; U.S. Pat. No. 8,807,432;
U.S. Pat. No. 8,820,630; U.S. Pat. No. 8,822,848;
U.S. Pat. No. 8,824,692; U.S. Pat. No. 8,824,696;
U.S. Pat. No. 8,842,849; U.S. Pat. No. 8,844,822;
U.S. Pat. No. 8,844,823; U.S. Pat. No. 8,849,019;
U.S. Pat. No. 8,851,383; U.S. Pat. No. 8,854,633;
U.S. Pat. No. 8,866,963; U.S. Pat. No. 8,868,421;
U.S. Pat. No. 8,868,519; U.S. Pat. No. 8,868,802;
U.S. Pat. No. 8,868,803; U.S. Pat. No. 8,870,074;
U.S. Pat. No. 8,879,639; U.S. Pat. No. 8,880,426;
U.S. Pat. No. 8,881,983; U.S. Pat. No. 8,881,987;
U.S. Pat. No. 8,903,172; U.S. Pat. No. 8,908,995;
U.S. Pat. No. 8,910,870; U.S. Pat. No. 8,910,875;
U.S. Pat. No. 8,914,290; U.S. Pat. No. 8,914,788;
U.S. Pat. No. 8,915,439; U.S. Pat. No. 8,915,444;
U.S. Pat. No. 8,916,789; U.S. Pat. No. 8,918,250;
U.S. Pat. No. 8,918,564; U.S. Pat. No. 8,925,818;

U.S. Pat. No. 8,939,374; U.S. Pat. No. 8,942,480;
U.S. Pat. No. 8,944,313; U.S. Pat. No. 8,944,327;
U.S. Pat. No. 8,944,332; U.S. Pat. No. 8,950,678;
U.S. Pat. No. 8,967,468; U.S. Pat. No. 8,971,346;
U.S. Pat. No. 8,976,030; U.S. Pat. No. 8,976,368;
U.S. Pat. No. 8,978,981; U.S. Pat. No. 8,978,983;
U.S. Pat. No. 8,978,984; U.S. Pat. No. 8,985,456;
U.S. Pat. No. 8,985,457; U.S. Pat. No. 8,985,459;
U.S. Pat. No. 8,985,461; U.S. Pat. No. 8,988,578;
U.S. Pat. No. 8,988,590; U.S. Pat. No. 8,991,704;
U.S. Pat. No. 8,996,194; U.S. Pat. No. 8,996,384;
U.S. Pat. No. 9,002,641; U.S. Pat. No. 9,007,368;
U.S. Pat. No. 9,010,641; U.S. Pat. No. 9,015,513;
U.S. Pat. No. 9,016,576; U.S. Pat. No. 9,022,288;
U.S. Pat. No. 9,030,964; U.S. Pat. No. 9,033,240;
U.S. Pat. No. 9,033,242; U.S. Pat. No. 9,036,054;
U.S. Pat. No. 9,037,344; U.S. Pat. No. 9,038,911;
U.S. Pat. No. 9,038,915; U.S. Pat. No. 9,047,098;
U.S. Pat. No. 9,047,359; U.S. Pat. No. 9,047,420;
U.S. Pat. No. 9,047,525; U.S. Pat. No. 9,047,531;
U.S. Pat. No. 9,053,055; U.S. Pat. No. 9,053,378;
U.S. Pat. No. 9,053,380; U.S. Pat. No. 9,058,526;
U.S. Pat. No. 9,064,165; U.S. Pat. No. 9,064,167;
U.S. Pat. No. 9,064,168; U.S. Pat. No. 9,064,254;
U.S. Pat. No. 9,066,032; U.S. Pat. No. 9,070,032;
U.S. Design Pat. No. D716,285;
U.S. Design Pat. No. D723,560;
U.S. Design Pat. No. D730,357;
U.S. Design Pat. No. D730,901;
U.S. Design Pat. No. D730,902;
U.S. Design Pat. No. D733,112;
U.S. Design Pat. No. D734,339;
International Publication No. 2013/163789;
International Publication No. 2013/173985;
International Publication No. 2014/019130;
International Publication No. 2014/110495;
U.S. Patent Application Publication No. 2008/0185432;
U.S. Patent Application Publication No. 2009/0134221;
U.S. Patent Application Publication No. 2010/0177080;
U.S. Patent Application Publication No. 2010/0177076;
U.S. Patent Application Publication No. 2010/0177707;
U.S. Patent Application Publication No. 2010/0177749;
U.S. Patent Application Publication No. 2010/0265880;
U.S. Patent Application Publication No. 2011/0202554;
U.S. Patent Application Publication No. 2012/0111946;
U.S. Patent Application Publication No. 2012/0168511;
U.S. Patent Application Publication No. 2012/0168512;
U.S. Patent Application Publication No. 2012/0193423;
U.S. Patent Application Publication No. 2012/0203647;
U.S. Patent Application Publication No. 2012/0223141;
U.S. Patent Application Publication No. 2012/0228382;
U.S. Patent Application Publication No. 2012/0248188;
U.S. Patent Application Publication No. 2013/0043312;
U.S. Patent Application Publication No. 2013/0082104;
U.S. Patent Application Publication No. 2013/0175341;
U.S. Patent Application Publication No. 2013/0175343;
U.S. Patent Application Publication No. 2013/0257744;
U.S. Patent Application Publication No. 2013/0257759;
U.S. Patent Application Publication No. 2013/0270346;
U.S. Patent Application Publication No. 2013/0287258;
U.S. Patent Application Publication No. 2013/0292475;
U.S. Patent Application Publication No. 2013/0292477;
U.S. Patent Application Publication No. 2013/0293539;
U.S. Patent Application Publication No. 2013/0293540;
U.S. Patent Application Publication No. 2013/0306728;
U.S. Patent Application Publication No. 2013/0306731;
U.S. Patent Application Publication No. 2013/0307964;
U.S. Patent Application Publication No. 2013/0308625;
U.S. Patent Application Publication No. 2013/0313324;
U.S. Patent Application Publication No. 2013/0313325;
U.S. Patent Application Publication No. 2013/0342717;
U.S. Patent Application Publication No. 2014/0001267;
U.S. Patent Application Publication No. 2014/0008439;
U.S. Patent Application Publication No. 2014/0025584;
U.S. Patent Application Publication No. 2014/0034734;
U.S. Patent Application Publication No. 2014/0036848;
U.S. Patent Application Publication No. 2014/0039693;
U.S. Patent Application Publication No. 2014/0042814;
U.S. Patent Application Publication No. 2014/0049120;
U.S. Patent Application Publication No. 2014/0049635;
U.S. Patent Application Publication No. 2014/0061306;
U.S. Patent Application Publication No. 2014/0063289;
U.S. Patent Application Publication No. 2014/0066136;
U.S. Patent Application Publication No. 2014/0067692;
U.S. Patent Application Publication No. 2014/0070005;
U.S. Patent Application Publication No. 2014/0071840;
U.S. Patent Application Publication No. 2014/0074746;
U.S. Patent Application Publication No. 2014/0076974;
U.S. Patent Application Publication No. 2014/0078341;
U.S. Patent Application Publication No. 2014/0078345;
U.S. Patent Application Publication No. 2014/0097249;
U.S. Patent Application Publication No. 2014/0098792;
U.S. Patent Application Publication No. 2014/0100813;
U.S. Patent Application Publication No. 2014/0103115;
U.S. Patent Application Publication No. 2014/0104413;
U.S. Patent Application Publication No. 2014/0104414;
U.S. Patent Application Publication No. 2014/0104416;
U.S. Patent Application Publication No. 2014/0104451;
U.S. Patent Application Publication No. 2014/0106594;
U.S. Patent Application Publication No. 2014/0106725;
U.S. Patent Application Publication No. 2014/0108010;
U.S. Patent Application Publication No. 2014/0108402;
U.S. Patent Application Publication No. 2014/0110485;
U.S. Patent Application Publication No. 2014/0114530;
U.S. Patent Application Publication No. 2014/0124577;
U.S. Patent Application Publication No. 2014/0124579;
U.S. Patent Application Publication No. 2014/0125842;
U.S. Patent Application Publication No. 2014/0125853;
U.S. Patent Application Publication No. 2014/0125999;
U.S. Patent Application Publication No. 2014/0129378;
U.S. Patent Application Publication No. 2014/0131438;
U.S. Patent Application Publication No. 2014/0131441;
U.S. Patent Application Publication No. 2014/0131443;
U.S. Patent Application Publication No. 2014/0131444;
U.S. Patent Application Publication No. 2014/0131445;
U.S. Patent Application Publication No. 2014/0131448;
U.S. Patent Application Publication No. 2014/0133379;
U.S. Patent Application Publication No. 2014/0136208;
U.S. Patent Application Publication No. 2014/0140585;
U.S. Patent Application Publication No. 2014/0151453;
U.S. Patent Application Publication No. 2014/0152882;
U.S. Patent Application Publication No. 2014/0158770;
U.S. Patent Application Publication No. 2014/0159869;
U.S. Patent Application Publication No. 2014/0166755;
U.S. Patent Application Publication No. 2014/0166759;
U.S. Patent Application Publication No. 2014/0168787;
U.S. Patent Application Publication No. 2014/0175165;
U.S. Patent Application Publication No. 2014/0175172;
U.S. Patent Application Publication No. 2014/0191644;
U.S. Patent Application Publication No. 2014/0191913;
U.S. Patent Application Publication No. 2014/0197238;
U.S. Patent Application Publication No. 2014/0197239;
U.S. Patent Application Publication No. 2014/0197304;
U.S. Patent Application Publication No. 2014/0214631;

U.S. Patent Application Publication No. 2014/0217166;
U.S. Patent Application Publication No. 2014/0217180;
U.S. Patent Application Publication No. 2014/0231500;
U.S. Patent Application Publication No. 2014/0232930;
U.S. Patent Application Publication No. 2014/0247315;
U.S. Patent Application Publication No. 2014/0263493;
U.S. Patent Application Publication No. 2014/0263645;
U.S. Patent Application Publication No. 2014/0267609;
U.S. Patent Application Publication No. 2014/0270196;
U.S. Patent Application Publication No. 2014/0270229;
U.S. Patent Application Publication No. 2014/0278387;
U.S. Patent Application Publication No. 2014/0278391;
U.S. Patent Application Publication No. 2014/0282210;
U.S. Patent Application Publication No. 2014/0284384;
U.S. Patent Application Publication No. 2014/0288933;
U.S. Patent Application Publication No. 2014/0297058;
U.S. Patent Application Publication No. 2014/0299665;
U.S. Patent Application Publication No. 2014/0312121;
U.S. Patent Application Publication No. 2014/0319220;
U.S. Patent Application Publication No. 2014/0319221;
U.S. Patent Application Publication No. 2014/0326787;
U.S. Patent Application Publication No. 2014/0332590;
U.S. Patent Application Publication No. 2014/0344943;
U.S. Patent Application Publication No. 2014/0346233;
U.S. Patent Application Publication No. 2014/0351317;
U.S. Patent Application Publication No. 2014/0353373;
U.S. Patent Application Publication No. 2014/0361073;
U.S. Patent Application Publication No. 2014/0361082;
U.S. Patent Application Publication No. 2014/0362184;
U.S. Patent Application Publication No. 2014/0363015;
U.S. Patent Application Publication No. 2014/0369511;
U.S. Patent Application Publication No. 2014/0374483;
U.S. Patent Application Publication No. 2014/0374485;
U.S. Patent Application Publication No. 2015/0001301;
U.S. Patent Application Publication No. 2015/0001304;
U.S. Patent Application Publication No. 2015/0003673;
U.S. Patent Application Publication No. 2015/0009338;
U.S. Patent Application Publication No. 2015/0009610;
U.S. Patent Application Publication No. 2015/0014416;
U.S. Patent Application Publication No. 2015/0021397;
U.S. Patent Application Publication No. 2015/0028102;
U.S. Patent Application Publication No. 2015/0028103;
U.S. Patent Application Publication No. 2015/0028104;
U.S. Patent Application Publication No. 2015/0029002;
U.S. Patent Application Publication No. 2015/0032709;
U.S. Patent Application Publication No. 2015/0039309;
U.S. Patent Application Publication No. 2015/0039878;
U.S. Patent Application Publication No. 2015/0040378;
U.S. Patent Application Publication No. 2015/0048168;
U.S. Patent Application Publication No. 2015/0049347;
U.S. Patent Application Publication No. 2015/0051992;
U.S. Patent Application Publication No. 2015/0053766;
U.S. Patent Application Publication No. 2015/0053768;
U.S. Patent Application Publication No. 2015/0053769;
U.S. Patent Application Publication No. 2015/0060544;
U.S. Patent Application Publication No. 2015/0062366;
U.S. Patent Application Publication No. 2015/0063215;
U.S. Patent Application Publication No. 2015/0063676;
U.S. Patent Application Publication No. 2015/0069130;
U.S. Patent Application Publication No. 2015/0071819;
U.S. Patent Application Publication No. 2015/0083800;
U.S. Patent Application Publication No. 2015/0086114;
U.S. Patent Application Publication No. 2015/0088522;
U.S. Patent Application Publication No. 2015/0096872;
U.S. Patent Application Publication No. 2015/0099557;
U.S. Patent Application Publication No. 2015/0100196;
U.S. Patent Application Publication No. 2015/0102109;
U.S. Patent Application Publication No. 2015/0115035;
U.S. Patent Application Publication No. 2015/0127791;
U.S. Patent Application Publication No. 2015/0128116;
U.S. Patent Application Publication No. 2015/0129659;
U.S. Patent Application Publication No. 2015/0133047;
U.S. Patent Application Publication No. 2015/0134470;
U.S. Patent Application Publication No. 2015/0136851;
U.S. Patent Application Publication No. 2015/0136854;
U.S. Patent Application Publication No. 2015/0142492;
U.S. Patent Application Publication No. 2015/0144692;
U.S. Patent Application Publication No. 2015/0144698;
U.S. Patent Application Publication No. 2015/0144701;
U.S. Patent Application Publication No. 2015/0149946;
U.S. Patent Application Publication No. 2015/0161429;
U.S. Patent Application Publication No. 2015/0169925;
U.S. Patent Application Publication No. 2015/0169929;
U.S. Patent Application Publication No. 2015/0178523;
U.S. Patent Application Publication No. 2015/0178534;
U.S. Patent Application Publication No. 2015/0178535;
U.S. Patent Application Publication No. 2015/0178536;
U.S. Patent Application Publication No. 2015/0178537;
U.S. Patent Application Publication No. 2015/0181093;
U.S. Patent Application Publication No. 2015/0181109;
U.S. patent application Ser. No. 13/367,978 for a Laser Scanning Module Employing an Elastomeric U-Hinge Based Laser Scanning Assembly, filed Feb. 7, 2012 (Feng et al.);
U.S. patent application Ser. No. 29/458,405 for an Electronic Device, filed Jun. 19, 2013 (Fitch et al.);
U.S. patent application Ser. No. 29/459,620 for an Electronic Device Enclosure, filed Jul. 2, 2013 (London et al.);
U.S. patent application Ser. No. 29/468,118 for an Electronic Device Case, filed Sep. 26, 2013 (Oberpriller et al.);
U.S. patent application Ser. No. 14/150,393 for Indicia-reader Having Unitary Construction Scanner, filed Jan. 8, 2014 (Colavito et al.);
U.S. patent application Ser. No. 14/200,405 for Indicia Reader for Size-Limited Applications filed Mar. 7, 2014 (Feng et al.);
U.S. patent application Ser. No. 14/231,898 for Hand-Mounted Indicia-Reading Device with Finger Motion Triggering filed Apr. 1, 2014 (Van Horn et al.);
U.S. patent application Ser. No. 29/486,759 for an Imaging Terminal, filed Apr. 2, 2014 (Oberpriller et al.);
U.S. patent application Ser. No. 14/257,364 for Docking System and Method Using Near Field Communication filed Apr. 21, 2014 (Showering);
U.S. patent application Ser. No. 14/264,173 for Autofocus Lens System for Indicia Readers filed Apr. 29, 2014 (Ackley et al.);
U.S. patent application Ser. No. 14/277,337 for MULTIPURPOSE OPTICAL READER, filed May 14, 2014 (Jovanovski et al.);
U.S. patent application Ser. No. 14/283,282 for TERMINAL HAVING ILLUMINATION AND FOCUS CONTROL filed May 21, 2014 (Liu et al.);
U.S. patent application Ser. No. 14/327,827 for a MOBILE-PHONE ADAPTER FOR ELECTRONIC TRANSACTIONS, filed Jul. 10, 2014 (Hejl);
U.S. patent application Ser. No. 14/334,934 for a SYSTEM AND METHOD FOR INDICIA VERIFICATION, filed Jul. 18, 2014 (Hejl);
U.S. patent application Ser. No. 14/339,708 for LASER SCANNING CODE SYMBOL READING SYSTEM, filed Jul. 24, 2014 (Xian et al.);

U.S. patent application Ser. No. 14/340,627 for an AXIALLY REINFORCED FLEXIBLE SCAN ELEMENT, filed Jul. 25, 2014 (Rueblinger et al.);
U.S. patent application Ser. No. 14/446,391 for MULTI-FUNCTION POINT OF SALE APPARATUS WITH OPTICAL SIGNATURE CAPTURE filed Jul. 30, 2014 (Good et al.);
U.S. patent application Ser. No. 14/452,697 for INTERACTIVE INDICIA READER, filed Aug. 6, 2014 (Todeschini);
U.S. patent application Ser. No. 14/453,019 for DIMENSIONING SYSTEM WITH GUIDED ALIGNMENT, filed Aug. 6, 2014 (Li et al.);
U.S. patent application Ser. No. 14/462,801 for MOBILE COMPUTING DEVICE WITH DATA COGNITION SOFTWARE, filed on Aug. 19, 2014 (Todeschini et al.);
U.S. patent application Ser. No. 14/483,056 for VARIABLE DEPTH OF FIELD BARCODE SCANNER filed Sep. 10, 2014 (McCloskey et al.);
U.S. patent application Ser. No. 14/513,808 for IDENTIFYING INVENTORY ITEMS IN A STORAGE FACILITY filed Oct. 14, 2014 (Singel et al.);
U.S. patent application Ser. No. 14/519,195 for HANDHELD DIMENSIONING SYSTEM WITH FEEDBACK filed Oct. 21, 2014 (Laffargue et al.);
U.S. patent application Ser. No. 14/519,179 for DIMENSIONING SYSTEM WITH MULTIPATH INTERFERENCE MITIGATION filed Oct. 21, 2014 (Thuries et al.);
U.S. patent application Ser. No. 14/519,211 for SYSTEM AND METHOD FOR DIMENSIONING filed Oct. 21, 2014 (Ackley et al.);
U.S. patent application Ser. No. 14/519,233 for HANDHELD DIMENSIONER WITH DATA-QUALITY INDICATION filed Oct. 21, 2014 (Laffargue et al.);
U.S. patent application Ser. No. 14/519,249 for HANDHELD DIMENSIONING SYSTEM WITH MEASUREMENT-CONFORMANCE FEEDBACK filed Oct. 21, 2014 (Ackley et al.);
U.S. patent application Ser. No. 14/527,191 for METHOD AND SYSTEM FOR RECOGNIZING SPEECH USING WILDCARDS IN AN EXPECTED RESPONSE filed Oct. 29, 2014 (Braho et al.);
U.S. patent application Ser. No. 14/529,563 for ADAPTABLE INTERFACE FOR A MOBILE COMPUTING DEVICE filed Oct. 31, 2014 (Schoon et al.);
U.S. patent application Ser. No. 14/529,857 for BARCODE READER WITH SECURITY FEATURES filed Oct. 31, 2014 (Todeschini et al.);
U.S. patent application Ser. No. 14/398,542 for PORTABLE ELECTRONIC DEVICES HAVING A SEPARATE LOCATION TRIGGER UNIT FOR USE IN CONTROLLING AN APPLICATION UNIT filed Nov. 3, 2014 (Bian et al.);
U.S. patent application Ser. No. 14/531,154 for DIRECTING AN INSPECTOR THROUGH AN INSPECTION filed Nov. 3, 2014 (Miller et al.);
U.S. patent application Ser. No. 14/533,319 for BARCODE SCANNING SYSTEM USING WEARABLE DEVICE WITH EMBEDDED CAMERA filed Nov. 5, 2014 (Todeschini);
U.S. patent application Ser. No. 14/535,764 for CONCATENATED EXPECTED RESPONSES FOR SPEECH RECOGNITION filed Nov. 7, 2014 (Braho et al.);
U.S. patent application Ser. No. 14/568,305 for AUTO-CONTRAST VIEWFINDER FOR AN INDICIA READER filed Dec. 12, 2014 (Todeschini);
U.S. patent application Ser. No. 14/573,022 for DYNAMIC DIAGNOSTIC INDICATOR GENERATION filed Dec. 17, 2014 (Goldsmith);
U.S. patent application Ser. No. 14/578,627 for SAFETY SYSTEM AND METHOD filed Dec. 22, 2014 (Ackley et al.);
U.S. patent application Ser. No. 14/580,262 for MEDIA GATE FOR THERMAL TRANSFER PRINTERS filed Dec. 23, 2014 (Bowles);
U.S. patent application Ser. No. 14/590,024 for SHELVING AND PACKAGE LOCATING SYSTEMS FOR DELIVERY VEHICLES filed Jan. 6, 2015 (Payne);
U.S. patent application Ser. No. 14/596,757 for SYSTEM AND METHOD FOR DETECTING BARCODE PRINTING ERRORS filed Jan. 14, 2015 (Ackley);
U.S. patent application Ser. No. 14/416,147 for OPTICAL READING APPARATUS HAVING VARIABLE SETTINGS filed Jan. 21, 2015 (Chen et al.);
U.S. patent application Ser. No. 14/614,706 for DEVICE FOR SUPPORTING AN ELECTRONIC TOOL ON A USER'S HAND filed Feb. 5, 2015 (Oberpriller et al.);
U.S. patent application Ser. No. 14/614,796 for CARGO APPORTIONMENT TECHNIQUES filed Feb. 5, 2015 (Morton et al.);
U.S. patent application Ser. No. 29/516,892 for TABLE COMPUTER filed Feb. 6, 2015 (Bidwell et al.);
U.S. patent application Ser. No. 14/619,093 for METHODS FOR TRAINING A SPEECH RECOGNITION SYSTEM filed Feb. 11, 2015 (Pecorari);
U.S. patent application Ser. No. 14/628,708 for DEVICE, SYSTEM, AND METHOD FOR DETERMINING THE STATUS OF CHECKOUT LANES filed Feb. 23, 2015 (Todeschini);
U.S. patent application Ser. No. 14/630,841 for TERMINAL INCLUDING IMAGING ASSEMBLY filed Feb. 25, 2015 (Gomez et al.);
U.S. patent application Ser. No. 14/635,346 for SYSTEM AND METHOD FOR RELIABLE STORE-AND-FORWARD DATA HANDLING BY ENCODED INFORMATION READING TERMINALS filed Mar. 2, 2015 (Sevier);
U.S. patent application Ser. No. 29/519,017 for SCANNER filed Mar. 2, 2015 (Zhou et al.);
U.S. patent application Ser. No. 14/405,278 for DESIGN PATTERN FOR SECURE STORE filed Mar. 9, 2015 (Zhu et al.);
U.S. patent application Ser. No. 14/660,970 for DECODABLE INDICIA READING TERMINAL WITH COMBINED ILLUMINATION filed Mar. 18, 2015 (Kearney et al.);
U.S. patent application Ser. No. 14/661,013 for REPROGRAMMING SYSTEM AND METHOD FOR DEVICES INCLUDING PROGRAMMING SYMBOL filed Mar. 18, 2015 (Soule et al.);
U.S. patent application Ser. No. 14/662,922 for MULTIFUNCTION POINT OF SALE SYSTEM filed Mar. 19, 2015 (Van Horn et al.);
U.S. patent application Ser. No. 14/663,638 for VEHICLE MOUNT COMPUTER WITH CONFIGURABLE IGNITION SWITCH BEHAVIOR filed Mar. 20, 2015 (Davis et al.);
U.S. patent application Ser. No. 14/664,063 for METHOD AND APPLICATION FOR SCANNING A BARCODE WITH A SMART DEVICE WHILE CONTINUOUSLY RUNNING AND DISPLAYING AN APPLICATION ON THE SMART DEVICE DISPLAY filed Mar. 20, 2015 (Todeschini);

U.S. patent application Ser. No. 14/669,280 for TRANSFORMING COMPONENTS OF A WEB PAGE TO VOICE PROMPTS filed Mar. 26, 2015 (Funyak et al.);
U.S. patent application Ser. No. 14/674,329 for AIMER FOR BARCODE SCANNING filed Mar. 31, 2015 (Bidwell);
U.S. patent application Ser. No. 14/676,109 for INDICIA READER filed Apr. 1, 2015 (Huck);
U.S. patent application Ser. No. 14/676,327 for DEVICE MANAGEMENT PROXY FOR SECURE DEVICES filed Apr. 1, 2015 (Yeakley et al.);
U.S. patent application Ser. No. 14/676,898 for NAVIGATION SYSTEM CONFIGURED TO INTEGRATE MOTION SENSING DEVICE INPUTS filed Apr. 2, 2015 (Showering);
U.S. patent application Ser. No. 14/679,275 for DIMENSIONING SYSTEM CALIBRATION SYSTEMS AND METHODS filed Apr. 6, 2015 (Laffargue et al.);
U.S. patent application Ser. No. 29/523,098 for HANDLE FOR A TABLET COMPUTER filed Apr. 7, 2015 (Bidwell et al.);
U.S. patent application Ser. No. 14/682,615 for SYSTEM AND METHOD FOR POWER MANAGEMENT OF MOBILE DEVICES filed Apr. 9, 2015 (Murawski et al.);
U.S. patent application Ser. No. 14/686,822 for MULTIPLE PLATFORM SUPPORT SYSTEM AND METHOD filed Apr. 15, 2015 (Qu et al.);
U.S. patent application Ser. No. 14/687,289 for SYSTEM FOR COMMUNICATION VIA A PERIPHERAL HUB filed Apr. 15, 2015 (Kohtz et al.);
U.S. patent application Ser. No. 29/524,186 for SCANNER filed Apr. 17, 2015 (Zhou et al.);
U.S. patent application Ser. No. 14/695,364 for MEDICATION MANAGEMENT SYSTEM filed Apr. 24, 2015 (Sewell et al.);
U.S. patent application Ser. No. 14/695,923 for SECURE UNATTENDED NETWORK AUTHENTICATION filed Apr. 24, 2015 (Kubler et al.);
U.S. patent application Ser. No. 29/525,068 for TABLET COMPUTER WITH REMOVABLE SCANNING DEVICE filed Apr. 27, 2015 (Schulte et al.);
U.S. patent application Ser. No. 14/699,436 for SYMBOL READING SYSTEM HAVING PREDICTIVE DIAGNOSTICS filed Apr. 29, 2015 (Nahill et al.);
U.S. patent application Ser. No. 14/702,110 for SYSTEM AND METHOD FOR REGULATING BARCODE DATA INJECTION INTO A RUNNING APPLICATION ON A SMART DEVICE filed May 1, 2015 (Todeschini et al.);
U.S. patent application Ser. No. 14/702,979 for TRACKING BATTERY CONDITIONS filed May 4, 2015 (Young et al.);
U.S. patent application Ser. No. 14/704,050 for INTERMEDIATE LINEAR POSITIONING filed May 5, 2015 (Charpentier et al.);
U.S. patent application Ser. No. 14/705,012 for HANDS-FREE HUMAN MACHINE INTERFACE RESPONSIVE TO A DRIVER OF A VEHICLE filed May 6, 2015 (Fitch et al.);
U.S. patent application Ser. No. 14/705,407 for METHOD AND SYSTEM TO PROTECT SOFTWARE-BASED NETWORK-CONNECTED DEVICES FROM ADVANCED PERSISTENT THREAT filed May 6, 2015 (Hussey et al.);
U.S. patent application Ser. No. 14/707,037 for SYSTEM AND METHOD FOR DISPLAY OF INFORMATION USING A VEHICLE-MOUNT COMPUTER filed May 8, 2015 (Chamberlin);
U.S. patent application Ser. No. 14/707,123 for APPLICATION INDEPENDENT DEX/UCS INTERFACE filed May 8, 2015 (Pape);
U.S. patent application Ser. No. 14/707,492 for METHOD AND APPARATUS FOR READING OPTICAL INDICIA USING A PLURALITY OF DATA SOURCES filed May 8, 2015 (Smith et al.);
U.S. patent application Ser. No. 14/710,666 for PRE-PAID USAGE SYSTEM FOR ENCODED INFORMATION READING TERMINALS filed May 13, 2015 (Smith);
U.S. patent application Ser. No. 29/526,918 for CHARGING BASE filed May 14, 2015 (Fitch et al.);
U.S. patent application Ser. No. 14/715,672 for AUGUMENTED REALITY ENABLED HAZARD DISPLAY filed May 19, 2015 (Venkatesha et al.);
U.S. patent application Ser. No. 14/715,916 for EVALUATING IMAGE VALUES filed May 19, 2015 (Ackley);
U.S. patent application Ser. No. 14/722,608 for INTERACTIVE USER INTERFACE FOR CAPTURING A DOCUMENT IN AN IMAGE SIGNAL filed May 27, 2015 (Showering et al.);
U.S. patent application Ser. No. 29/528,165 for IN-COUNTER BARCODE SCANNER filed May 27, 2015 (Oberpriller et al.);
U.S. patent application Ser. No. 14/724,134 for ELECTRONIC DEVICE WITH WIRELESS PATH SELECTION CAPABILITY filed May 28, 2015 (Wang et al.);
U.S. patent application Ser. No. 14/724,849 for METHOD OF PROGRAMMING THE DEFAULT CABLE INTERFACE SOFTWARE IN AN INDICIA READING DEVICE filed May 29, 2015 (Barten);
U.S. patent application Ser. No. 14/724,908 for IMAGING APPARATUS HAVING IMAGING ASSEMBLY filed May 29, 2015 (Barber et al.);
U.S. patent application Ser. No. 14/725,352 for APPARATUS AND METHODS FOR MONITORING ONE OR MORE PORTABLE DATA TERMINALS (Caballero et al.);
U.S. patent application Ser. No. 29/528,590 for ELECTRONIC DEVICE filed May 29, 2015 (Fitch et al.);
U.S. patent application Ser. No. 29/528,890 for MOBILE COMPUTER HOUSING filed Jun. 2, 2015 (Fitch et al.);
U.S. patent application Ser. No. 14/728,397 for DEVICE MANAGEMENT USING VIRTUAL INTERFACES CROSS-REFERENCE TO RELATED APPLICATIONS filed Jun. 2, 2015 (Caballero);
U.S. patent application Ser. No. 14/732,870 for DATA COLLECTION MODULE AND SYSTEM filed Jun. 8, 2015 (Powilleit);
U.S. patent application Ser. No. 29/529,441 for INDICIA READING DEVICE filed Jun. 8, 2015 (Zhou et al.);
U.S. patent application Ser. No. 14/735,717 for INDICIA-READING SYSTEMS HAVING AN INTERFACE WITH A USER'S NERVOUS SYSTEM filed Jun. 10, 2015 (Todeschini);
U.S. patent application Ser. No. 14/738,038 for METHOD OF AND SYSTEM FOR DETECTING OBJECT WEIGHING INTERFERENCES filed Jun. 12, 2015 (Amundsen et al.);
U.S. patent application Ser. No. 14/740,320 for TACTILE SWITCH FOR A MOBILE ELECTRONIC DEVICE filed Jun. 16, 2015 (Bandringa);

U.S. patent application Ser. No. 14/740,373 for CALIBRATING A VOLUME DIMENSIONER filed Jun. 16, 2015 (Ackley et al.);

U.S. patent application Ser. No. 14/742,818 for INDICIA READING SYSTEM EMPLOYING DIGITAL GAIN CONTROL filed Jun. 18, 2015 (Xian et al.);

U.S. patent application Ser. No. 14/743,257 for WIRELESS MESH POINT PORTABLE DATA TERMINAL filed Jun. 18, 2015 (Wang et al.);

U.S. patent application Ser. No. 29/530,600 for CYCLONE filed Jun. 18, 2015 (Vargo et al);

U.S. patent application Ser. No. 14/744,633 for IMAGING APPARATUS COMPRISING IMAGE SENSOR ARRAY HAVING SHARED GLOBAL SHUTTER CIRCUITRY filed Jun. 19, 2015 (Wang);

U.S. patent application Ser. No. 14/744,836 for CLOUD-BASED SYSTEM FOR READING OF DECODABLE INDICIA filed Jun. 19, 2015 (Todeschini et al.);

U.S. patent application Ser. No. 14/745,006 for SELECTIVE OUTPUT OF DECODED MESSAGE DATA filed Jun. 19, 2015 (Todeschini et al.);

U.S. patent application Ser. No. 14/747,197 for OPTICAL PATTERN PROJECTOR filed Jun. 23, 2015 (Thuries et al.);

U.S. patent application Ser. No. 14/747,490 for DUAL-PROJECTOR THREE-DIMENSIONAL SCANNER filed Jun. 23, 2015 (Jovanovski et al.); and U.S. patent application Ser. No. 14/748,446 for CORDLESS INDICIA READER WITH A MULTIFUNCTION COIL FOR WIRELESS CHARGING AND EAS DEACTIVATION, filed Jun. 24, 2015 (Xie et al.).

In the specification and/or figures, typical embodiments and environments of the invention have been disclosed. The present invention is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

The invention claimed is:

1. An exit system for a building, comprising:
at least one exit sign, the exit sign comprising:
a display;
at least one sensor;
at least one transceiver;
a power source; and
a central processor integrated with the display, the at least one sensor, the at least one transceiver, and the power source;
a remote server in electronic communication with the exit sign;
a portable electronic device carried by a user, the portable electronic device being in electronic communication with the exit sign and the remote server; and
an application installed on the portable electronic device, the application configured to transmit and receive data from the exit sign and the remote server;
wherein, in response to the at least one sensor detecting an emergency event, the central processor is configured to (i) actively update the exit sign to display emergency event information; and (ii) transmit emergency event information to the remote server or the user via the transceiver.

2. The system of claim 1, wherein the portable electronic device carried by a user comprises a GPS location device, and wherein the GPS location device generates positional data that is received by the exit sign transceiver.

3. The system of claim 2, comprising object positional devices located adjacent objects within the building, wherein the object positional devices are in electronic communication with the remote server.

4. The system of claim 3, wherein the exit sign is configured to transmit data relating to the building environment to the remote server.

5. The system of claim 4, comprising an external power source electrically connected to the exit sign.

6. The system of claim 5, wherein the memory component stores information including at least one of: object locations, emergency event logs, sensor logs, user identities, and object identities.

7. The system of claim 6, wherein the display comprises a liquid crystal display.

8. The system of claim 7, wherein the at least one transceiver is selected from the group consisting of: LAN, WiFi, BLUETOOTH, fiber optic, cellular, RF, UWB, and combinations thereof.

9. An active exit system for a building, comprising:
a first exit sign and a second exit sign, wherein the first and second exit signs are each located proximate an exit of the building or an exit of a portion of the building, each exit sign comprising:
a display;
at least one sensor;
at least one transceiver;
a back-up power source; and
a central processor integrated with the display, the at least one sensor, the at least one transceiver, the memory component, and the back-up power source,
an external primary power source electrically connected to the exit sign;
a remote server, the remote server and the exit signs in electronic communication;
a portable electronic device carried by a user, wherein (i) the portable electronic device is in electronic communication with the remote server, (ii) the portable electronic device comprises a GPS location device, and (iii) wherein the GPS location device generates positional data that is received by at least one exit sign transceiver; and
an application installed on the portable electronic device, the application configured to transmit and receive data from the exit sign and the remote server;
wherein the at least one transceiver communicates with the server to provide the positional data to the user; and
wherein, in response to the at least one sensor of the first or second exit sign sensing an emergency event, the first and second exit signs display emergency event information.

10. The system of claim 9, comprising object positional devices located adjacent objects within the building, wherein the object positional devices are in electronic communication with the remote server.

11. The system of claim 10, wherein the at least one transceiver communicates with the server to provide the positional data to a user.

12. The system of claim 11, wherein, in response to an emergency event, the first or second exit sign transmits an updated building exit plan to the user based upon positional data that is received by at least one exit sign transceiver.

13. The system of claim 12, comprising a building environmental control system in electronic communication with the remote server, and wherein the exit sign is configured to transmit data relating to the building environment to the remote server.

14. The system of claim 13, wherein the memory component stores information including at least one of: object locations, emergency event logs, sensor logs, user identities, and object identities.

15. The system of claim 14, wherein the display comprises a liquid crystal display.

16. The system of claim 15, wherein the at least one transceiver is selected from the group consisting of: LAN, Wi-Fi, BLUETOOTH, fiber optic, cellular, RF, UWB and combinations thereof.

17. A method for providing an active exit system for a building, comprising:

sensing one or more environmental conditions within a building using at least one exit sign, the exit sign comprising:

a display;

at least one sensor selected from the group consisting of: a human presence sensor, a temperature sensor, a humidity sensor, a noxious gas sensor, and a fire sensor;

at least one transceiver;

a back-up power source;

a memory component, the memory component storing at least one building exit plan; and a central processor integrated with the display, the at least one sensor, the at least one transceiver, the memory component, and the back-up power source;

sensing a location of a portable electronic device carried by a user within the building, the portable electronic device having an application installed thereon, the application configured to transmit and receive data from the exit sign and a remote server, the portable electronic device being in electronic communication with the at least one exit sign and the remote server;

sensing a location of an object within the building;

transmitting a map to the portable electronic device, the map providing an exit plan from the location of the user;

detecting an emergency event within the building based at least in part on the one or more environmental conditions sensed by the at least one sensor;

transmitting an emergency signal to the portable electronic device in response to detecting the emergency event within the building environment; and causing the central processor to (i) actively update the exit sign to display emergency event information; and (ii) transmit emergency event information to the remote server or the user via the transceiver.

18. The method of claim 17, comprising transmitting a map to the portable electronic device, the map providing a path from the location of the user to the object.

19. The method of claim 17, comprising transmitting the location of the user to emergency responders in response to detecting the emergency event within the building.

20. The method of claim 17, comprising transmitting an updated exit plan to the user in response to detecting the emergency event within the building, the updated exit plan including the location of the emergency event.

* * * * *